(12) United States Patent
Mahgerefteh

(10) Patent No.: US 6,331,991 B1
(45) Date of Patent: Dec. 18, 2001

(54) TRANSMISSION SYSTEM USING A SEMICONDUCTOR LASER AND A FIBER GRATING DISCRIMINATOR

(75) Inventor: Daniel Mahgerefteh, Washington, DC (US)

(73) Assignee: The United States of America as represented by the National Security Agency, Washington, DC (US)

( * ) Notice: Subject to any disclaimer, the term of this patent is extended or adjusted under 35 U.S.C. 154(b) by 0 days.

(21) Appl. No.: 09/354,107

(22) Filed: Jul. 15, 1999

Related U.S. Application Data

(60) Provisional application No. 60/093,189, filed on Jul. 17, 1998, and provisional application No. 60/128,096, filed on Apr. 7, 1999.

(51) Int. Cl.[7] ............... H01S 3/10; H01S 3/13; H01S 3/00; H01S 3/04; G02B 6/28; G02B 6/34
(52) U.S. Cl. ............... 372/33; 372/25; 372/26; 372/34; 372/29.01; 385/37; 385/24
(58) Field of Search ............... 372/33, 34, 26, 372/29.015, 29.02, 29.01, 25, 46, 43, 102; 385/37, 24, 1

(56) References Cited

U.S. PATENT DOCUMENTS

| | | | | |
|---|---|---|---|---|
| 4,805,235 | * | 2/1989 | Henmi | 455/608 |
| 5,432,631 | | 7/1995 | Mamyshev et al. | |
| 5,473,458 | | 12/1995 | Mamyshev. | |
| 6,058,128 | * | 5/2000 | Ventrudo | 372/96 |
| 6,072,615 | | 6/2000 | Mamyshev. | |
| 6,104,851 | * | 8/2000 | Mahgerefteh | 385/37 |

* cited by examiner

Primary Examiner—Frank G. Font
Assistant Examiner—Armando Rodriguez
(74) Attorney, Agent, or Firm—Robert D. Morelli

(57) ABSTRACT

The optical signal produced by a modulated semiconductor laser is passed through a fiber grating optical discriminator to increase the modulation response of the device and decrease the output chirp for transmission through optical fiber. In one embodiment, a simple pulse source comprises a directly modulated single mode semiconductor laser and a fiber Bragg grating filter. A single-mode semiconductor laser, such as, a distributed feed-back laser is driven by the addition of a DC bias current and a sinusoidal current at the desired bit rate. The output of the laser is passed through a low pass or high pass fiber Bragg grating filter with a sharp edge to produce nearly transform limited pulses. Stabilization of a laser apparatus is included.

17 Claims, 29 Drawing Sheets

TRANSMISSION SYSTEM USING A SEMICONDUCTOR LASER AND A FIBER GRATING DISCRIMINATOR

This application claims the benefit of priority to each of the following applications:

1. "Technique For Increasing Operation Speed Of Semiconductor Optical Devices" Ser. No. 60/046,634, filed May 16, 1997
2. "Technique To Improve Performance Of Optical Logic Devices That Use The Semiconductor Optical Amplifier" Ser. No. 60/042,595, filed Apr. 2, 1997.
3. "Transmission System Comprising a Semiconductor Laser and a Fiber Grating Discriminator," filed Apr. 24, 1998, and assigned, application No. 09/065,686 now U.S. Pat. No. 6,104,851;
4. "Technique for Generation of High Repetition Rate Transform Limited Optical Pulses," filed Jul. 17, 1998, and assigned application Ser. No. 60/093,189; and
5. "Stabilization of Transmission System Comprising a Semiconductor Laser and a Fiber Grating Discriminator," filed Apr. 7, 1999, and assigned application Ser. No. 60/128,096.

The above-cited applications are incorporated by reference herein in their entirety.

STATEMENT AS TO RIGHTS TO INVENTIONS MADE UNDER FEDERALLY-SPONSORED RESEARCH AND DEVELOPMENT

Part of the work performed during development of this invention utilized U.S. Government funds (NSA Contract Number: MDA 90496C-0892). The U.S. Government has certain rights in this invention.

BACKGROUND OF THE INVENTION

The invention relates to semiconductor laser transmitters for use in fiber-optic communication systems.

Directly modulated semiconductor lasers are attractive for use as transmitters in optical communication because they are compact, have large response to modulation, and are integrable. In addition they are inexpensive compared to externally-modulated transmitters, which require an intensity modulator, usually $LiNbO_3$, following the laser. However, they suffer from the major drawback that their outputs are highly chirped. Chirp is the rapid change in optical frequency or phase that accompanies an intensity modulated signal. Chirped pulses become distorted after propagation through tens of km of dispersive optical fiber, increasing system power penalties to unacceptable levels. This has limited the use of directly modulated laser transmitters to propagation distances of only tens of km at 2.5 Gb/s as described by P. J. Corvini and T. L. Koch, *Journal of Lightwave Technology* vol. LT-5, no. 11, 1591 (1987). The distortion-less transmission distances become even shorter for higher bit rates.

An alternative transmission system that produces reduced chirp was described by R. E Epworth in UK patent GB2107147A in which the modulated laser is followed by an optical frequency discriminator. The laser bias current is modulated by the electrical signal to produce small amplitude modulation as well as modulation of the laser frequency. The discriminator then converts the FM modulation to AM modulation. Epworth cites classic optical discriminators, namely Mach-Zehnder interferometer, Michelson interferometer, and two Fabry-Perot resonators for implementation of this invention. N. Henmi describes a very similar system in U.S. Pat. No. 4,805,235, also using a free-space interferometer.

The above are all free-space discriminators comprising mirrors and partial reflectors which are bulky and required mechanical feed-back control for their stabilization. Also coupling of light from fiber to these devices and back introduces loss as well as additional optical components. Furthermore tuning the discriminator for optimum position requires a mechanical adjustment of the phase differential in one arm of the interferometer. As stated in UK patent GB 2,107147A, the modulated laser frequency varies by only 10–20 GHz, so to obtain a IO GHz frequency discrimination, a ~1.5 cm free-space delay is needed, which requires use of mechanically driven parts. Piezoelectric elements can only make small motions and are known to drift, requiring further stabilization circuits.

N. Henmi in U.S. Pat. No. 4,805,235, also sites the use of a diffraction grating discriminator. To obtain 10–20 GHz frequency discrimination as stated above, the diffraction grating has to have a resolution of a few GHz to discriminate between the "Is" and "Os" in a digital system. From *"The Feynman Lectures on Physics"* vol. 1, Addision Wesley, MA (1963), a frequency resolution $\Delta v \sim 1$ GHz requires a time difference between extreme paths of $\Delta t \sim 1/\Delta v \sim 1$ ns corresponding to a larger than 1 ft wide diffraction grating. As described in U.S. Pat. No. 4,805,235, light beams of different frequency components have to diffract before they are separated by slits a distance away from the diffraction grating. This makes for a bulky device. Also, as for the other free-space optics discriminators mentioned above, it suffers from fiber coupling loss and requires mechanical tuning.

In U.S. Pat. No. 5,317,384, J. P. King describes a fiber Mach-Zehnder interferometer as discriminator comprising polarization-preserving fibers, couplers, and a fiber delay line. This discriminator is an improvement over the previously mentioned discriminators in that it is in-fiber and is polarization insensitive. Discrimination is achieved by making one arm of the interferometer longer length of fiber (we calculate, by ~1 cm longer for 10 GHz variation). This has the disadvantage that the discriminator cannot be tuned. Also, it is a complicated structure comprising two fiber polarization splitters, two fiber couplers, four cross splices and a regular splice.

Furthermore the transfer function of a Mach-Zehnder discriminators is limited to being sinusoidal. For digital applications, a sinusoidal transfer function is not optimum and leads to distortion if the frequency excursion of the laser exceeds the range of the transfer function between a first maximum and minimum.

In addition, the return-to-zero (RZ), modulation format is being considered for use in 10 Gb/s and 40 Gb/s long haul fiber optic systems. Record propagation distances exceeding 28000 km have been demonstrated at 10 Gb/s in a dispersion-managed soliton system experiments using this format. One of the obstacles in deployment of RZ systems is the lack of inexpensive, compact, high bit rate sources of nearly transform limited optical pulses with low timing jitter.

A number of techniques for pulse generation exist, but all have major drawbacks. Gain-switched and filtered distributed feed-back lasers suffer from timing jitter and extreme chirp. Mode-locked semiconductor lasers using external cavities are difficult to engineer, typically have fixed bit rate that is locked to a cavity length, and are specially expensive. Schemes using intensity modulation of CW signal suffer from bias drift of the external intensity modulator.

P. V. Mamyshev has shown that removing the central frequency components of a phase modulated CW signal produces transform limited pulses at high repetition rate. This technique is simpler than all previously mentioned sources and requires a CW laser and a phase modulator, typically $LiNbO_3$, modulated at the desired bit rate, and a low pass or high pass optical filter. In addition, bias drift is not a problem for the phase modulator. In order to produce relatively short pulses at 10 Gb/s, the modulator must impart a phase shift of ~π-1.5π at this bit rate and therefore requires excessive RF power of 27–32 dBm. In addition, $LiNbO_3$ modulators are expensive and somewhat bulky for to the limited space on a commercial transmitter card.

Further, long-haul DWDM systems require compact, low-chirp transmitters with stabilized frequency. External modulation transmitters are expensive and require additional optics for wavelength stabilization. Directly modulated external-cavit fiber-grating lasers have frequency stability, but are limited to a penalty-free propagation distance of ~117 km in non-dispersion-shifted (NDS) fiber at 2.5 Gb/s.

Recently, Chang-Hee Lee et al., Technical Digest, CLEO' 95, vol 15, paper CtuI10 (incorporated by reference) used a band-pass filter to reduce the chirp of a directly modulated laser obtaining a 1.5 dB penalty after 200 km of NDS fiber at 2.5 Gb/s. P. A. Morton, et al., Electron. Lett. Vol. 33, p. 310 (1997)(incorporated by reference) demonstrated 38.5 km propagation in NDS fiber at 10 Gb/s using this technique. Filtering has also been considered the FSK demodulation. A similar method, called dispersion-supported transmission (DST), uses fiber dispersion for frequency to amplitude conversion of a directly modulated signal. In this scheme, transmitter chirp has to be adjusted to a given fiber dispersion and length, and an unconventional receiver is needed.

SUMMARY OF THE INVENTION

The present invention provides a transmission system comprising a modulated semiconductor laser and a simple, tunable, fiber-based, polarization insensitive optical discriminator capable of providing an output with reduced chirp. According to an aspect of this invention, the current of a semiconductor laser is modulated while it is biased high above threshold. The frequency-modulated output of the laser is passed through a fiber grating discriminator with step-like spectrum such that the laser frequency varies between the ~0 and ~100% transmission regions of the grating spectrum for the logical 0 and 1 bits, respectively.

Another aspect of the present invention is an all-optical wavelength converter comprising a semiconductor laser and a fiber grating discriminator. The semiconductor laser is modulated by an optical signal of a different wavelength and the modulated output is passed through the discriminator as described above.

Transform Limited Optical Pulse Source

According to a further embodiment of the present invention, a simple pulse source comprises a directly modulated single mode semiconductor laser and a fiber Bragg grating filter. A single-mode semiconductor laser, such as, a distributed feed-back laser is driven by the addition of a DC bias current and a sinusoidal current at the desired bit rate. The output of the laser is passed through a low pass or high pass fiber Bragg grating filter with a sharp edge. This embodiment produces output optical pulses at a high repetition rate which are transform limited or nearly transform limited.

Stabilization

According to a further embodiment of the present invention, stabilization is provided for a directly modulated laser and a fiber grating optical discriminator. The amplitude of the 1 bits and 0 bits at the output of the transmitter is stabilized against drifts in the laser wavelength relative to the fiber Bragg grating.

The present invention further provides a simple, low-speed electronic monitor that flags an alarm in the case that the electrical data modulating the transmitter is removed.

The present invention further provides a multi-channel transmitter than can transmit at a number of discrete channels with low chirp.

Example

In one example implementation, a fiber Bragg grating high-pass filter after a DFB laser transmitter is used to demonstrate propagation over 600 km of NDS fiber at 2.5 Gb/s with <1 GHz wavelength stability. A DFB laser is modulated to produce an optical signal with 20%–40% modulation depth. This minimizes transient chirp, leaving adiabatic chirp which makes ones and zeros have different frequencies. A fiber Bragg grating with a sharp, step-like response passes the ones and blocks, the zeros. Hence most of the remaining energy has the same optical frequency and does not spread quickly upon propagation.

Further features and advantages of the present invention, as well as the structure and operation of various embodiments of the present invention, are described in detail below with reference to the accompanying drawings.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the pertinent art to make and use the invention.

FIG. 11A is a plot of time-varying power output. FIG. 11B is a plot of a time-varying frequency shift. FIG. 11C is a plot of time-varying phase shift. FIG. 11D is a plot of the time-varying output power after low-pass filtering.

FIGS. 12A and 12B shows plots of a spectrum before and after low-pass filtering, respectively. FIGS. 12C and 12D shows plots of a resulting pulse envelope and linear phase variation across a pulse.

FIGS. 13A and 13B shows plots of a spectrum before and after high-pass filtering, respectively. FIGS. 13C and 13D shows plots of a resulting pulse envelope and linear phase variation across a pulse.

DETAILED DESCRIPTION OF THE PREFERRED EMBODIMENT

Figure 1:
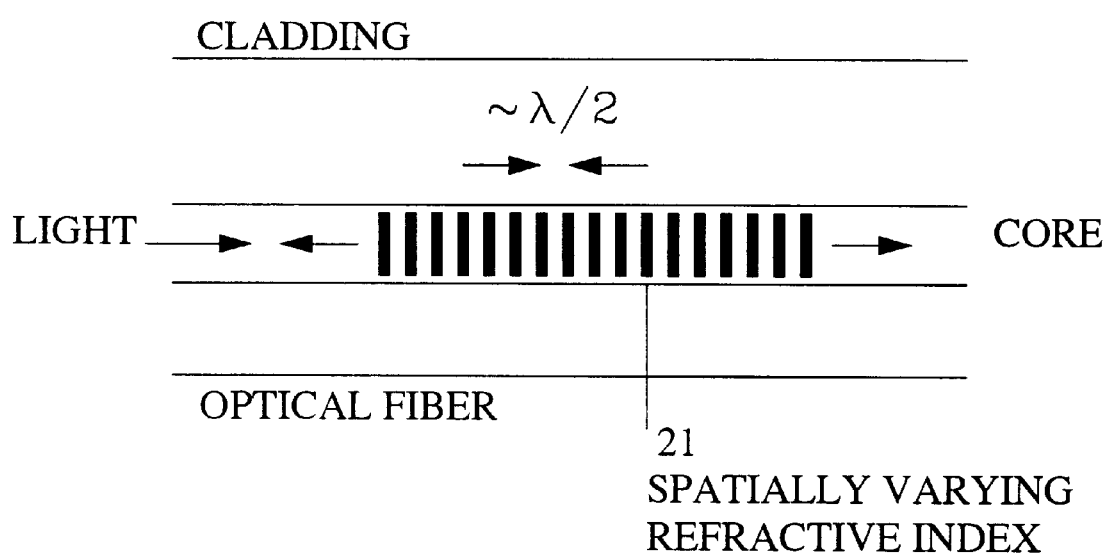
FIG. 1 Fiber Bragg grating optical discriminator.

One key to the present invention is a fiber grating optical discriminator shown in FIG. 1 with a transmission function that can be designed for various applications. The fiber grating comprises a spatially varying refractive index modulation 21 along the propagation direction in an optical fiber. The index variation is produced by exposing an optical fiber to a spatially varying intensity pattern at ultraviolet wavelength as described by K. O. Hill and G. Meltz in *J. Lightwave Technol.* 15:1263–1276 (1997) (incorporated herein by reference). The fiber grating couples light traveling in the fiber from one fiber mode to another, thus forming an optical transmission or reflection filter. Fiber grating spectra can be tailored by the pattern design used in its formation as described by T. Erdogan in *J. Lightwave Technol.* 15:1277–1294 (1997) (incorporated herein be reference).

Relevant to the present invention, fiber grating spectra can be made to have sharp transitions between ~0% and ~100% transmission as a function of optical frequency. The edge of transmission or reflection band of a fiber grating thus forms out optical discriminator. Fiber gratings are polarization insensitive and can be frequency discriminator temperature tuned.

Figure 2:
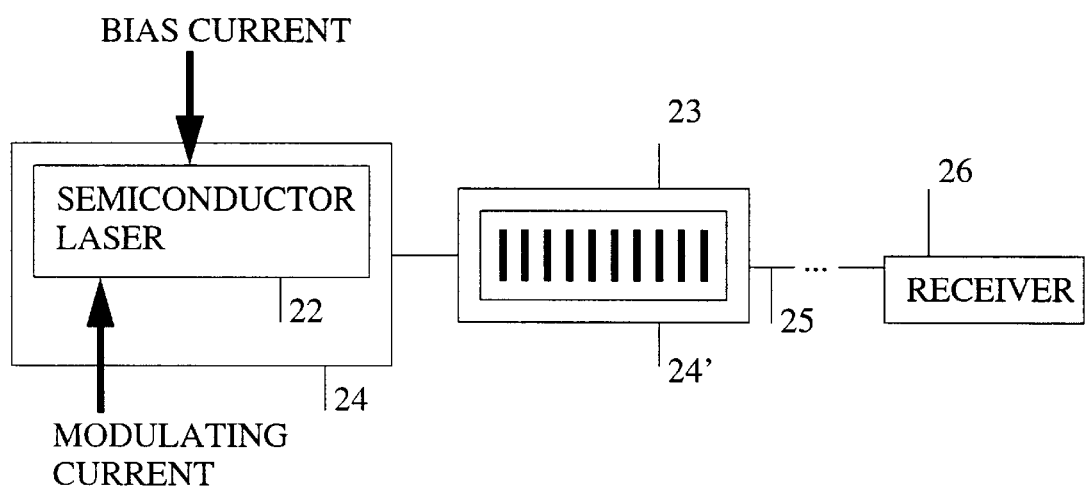
FIG. 2 Laser transmitter comprising a fiber Bragg grating discriminator.
Figure 3:
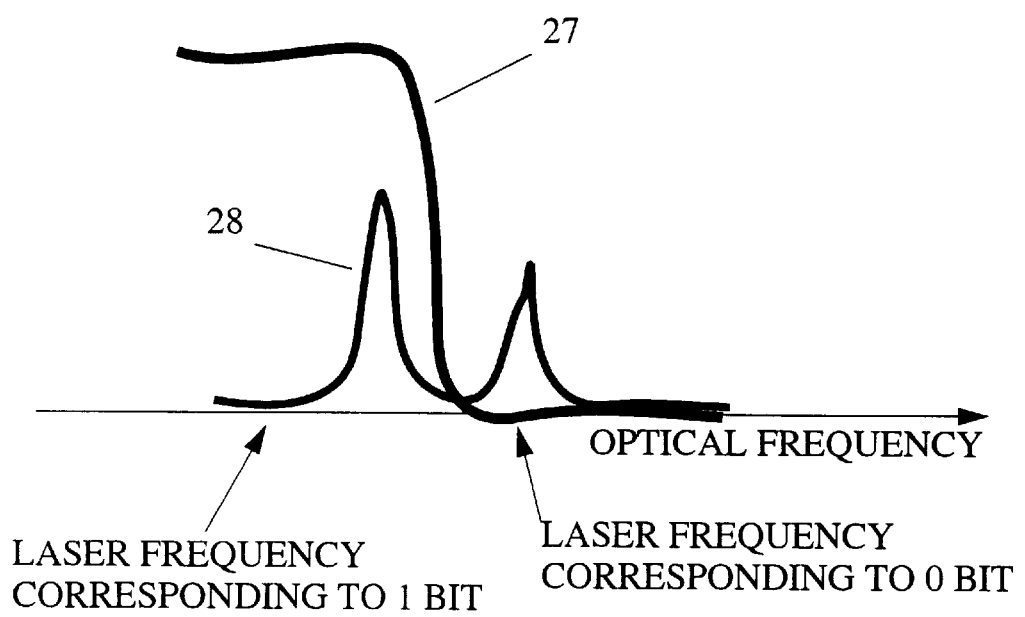
FIG. 3 Placement of laser spectrum relative to fiber grating spectrum for non-inverting operation of transmitter.

The present invention shown in FIG. 2 biases a semiconductor laser 22 high above its lasing threshold and to modulate the laser 22 with a small electrical signal, while a fiber grating discriminator 23 with step-like spectrum is placed after the laser 22. The temperature of the laser and fiber grating are kept fixed by temperature controllers 24 and 24'. The output of the fiber grating 23 is transmitted through a length of optical fiber 25 and the signal detected with a receiver 26. The laser 22 and/or fiber grating 23 are adjusted such that the laser frequency varies between the two frequencies corresponding to the ~0 and ~100% transmission regions of the grating spectrum 27 for logical 0 and 1 bits, respectively as shown in FIG. 3. The spectrum of laser 22 and the fiber grating discriminator 23 can be tuned relative to each other by changing temperature of either device. It is known that the fiber grating spectrum shifts by changing the fiber temperature. If desired, the spectrum of the fiber grating can also be made insensitive to temperature variations by attaching it to a support member having a negative coefficient of thermal expansion as described in U.S. Pat. No. 5,694,503 (incorporated herein by reference). Also, the fiber grating spectrum can be tailored such that the step transition is on the order of the frequency excursion of the laser upon modulation (few GHz).

The fiber grating discriminator described herein is insensitive to the polarization of the incident light.

Figure 4:
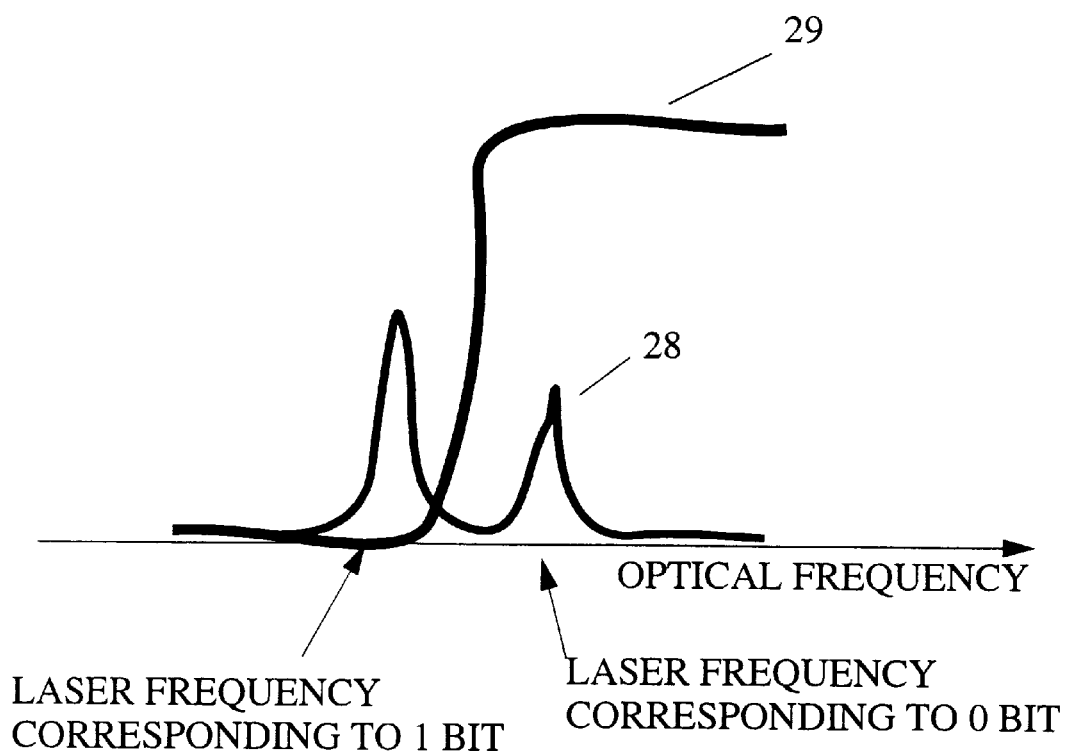
FIG. 4 Placement of laser spectrum relative to fiber grating spectrum for inverting operation of transmitter.
Figure 5:
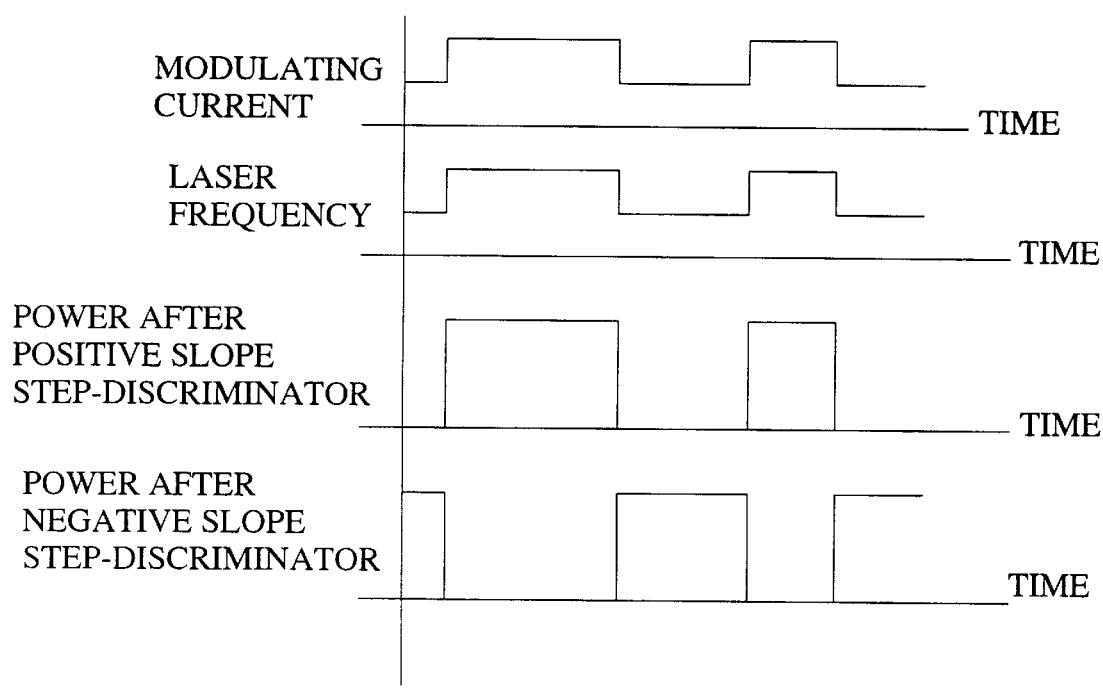
FIG. 5 Modulating current, laser frequency, output of transmitter, and chirp of transmitter for inverting and non-inverting operations.

The output optical data produced in this way has a small chirp since the gain variation of the laser and the corresponding frequency modulation at the transitions of 1s and 0s are small. Choosing a negative slope step as shown in FIG. 3 produces an optical data stream which is not inverted relative to the electrical drive current, while choosing a fiber grating spectrum 29 with negative-slope step for the same laser spectrum 28 as shown in FIG. 4 produces inverted data. FIG. 5 shows the modulation current, optical frequency, and inverting and non-inverting data outputs.

Figure 6:
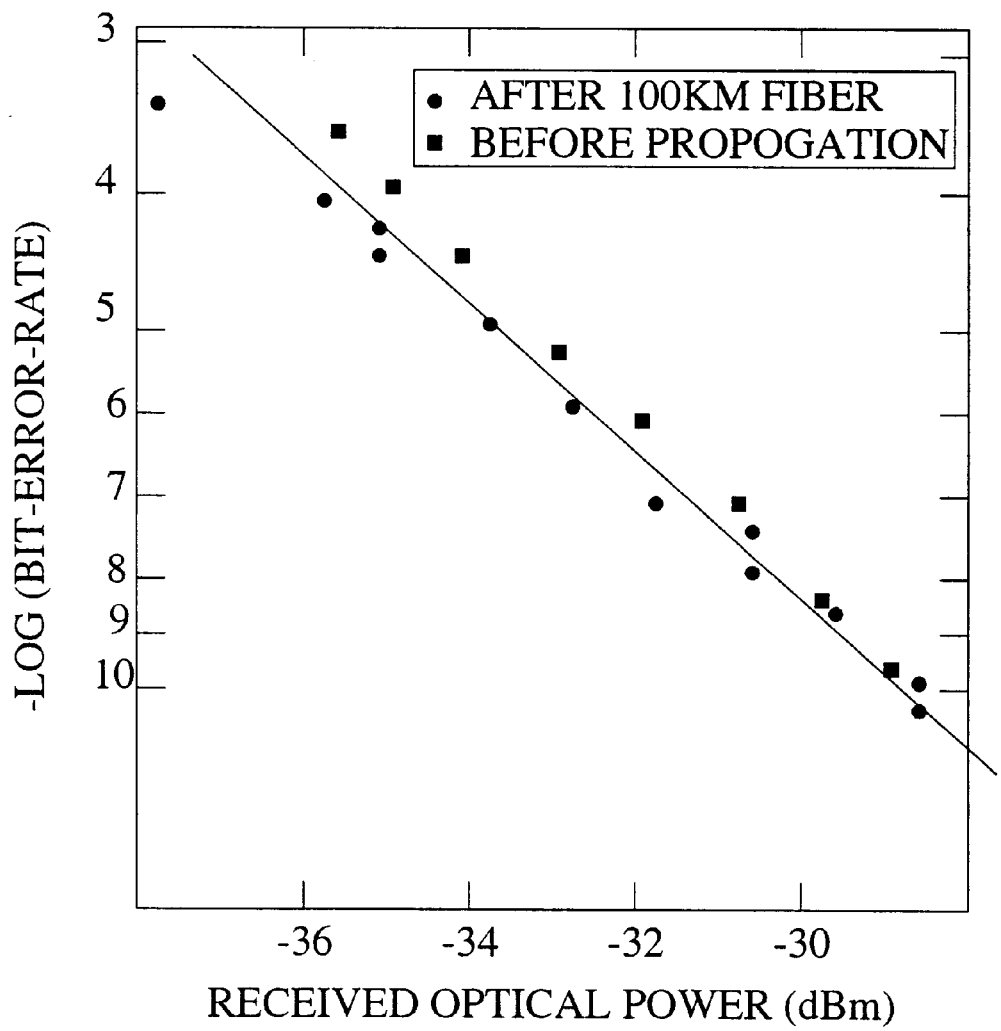
FIG. 6 Bit-error rate performance of a laser transmitter based on the present invention.

This invention was applied to demonstrate a transmitter comprising a distributed feed-back laser operating at 1546 nm, a fiber Bragg grating discriminator and a length of non-dispersion shifted optical fiber with zero dispersion near 1310 nm. The laser current was modulated using non-return-to-zero (NRZ) data from a bit-error-rate test set at 5 Gb/s. Non-return-to-zero refers to a binary data format in which the signal is not reset to zero between bits. The bias current of the laser was high above threshold. FIG. 6 shows the bit-error-rate curves at the output of the fiber grating and after 100 km of propagation through non-dispersion shifted fiber at 5 Gb/s. There is no power penalty incurred after propagation indicating that the pulses have little or no chirp. Also the extinction ratio of the output was ~10. Error-free transmission was not possible without the fiber grating discriminator even at a lower bit rate of 2.5 Gb/s and a shorter distance of 60 km.

Figure 7:
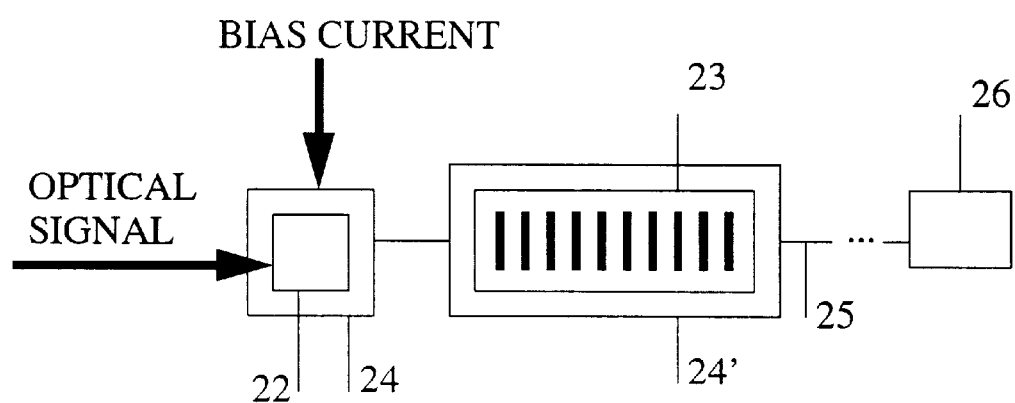
FIG. 7 Optical wavelength converter based on the present invention.

Another embodiment of the present invention is shown in FIG. 7 in which the output intensity and frequency of a semiconductor laser 22 is modulated by an optical signal at a different wavelength. The output of the laser 22 is passed through a fiber grating discriminator 23. The spectrum of the laser and fiber grating discriminator 23 are adjusted as described above for inverted or non-inverted output data. This data is transmitted through an optical fiber 25 before being detected by a receiver 26 some distance away. This forms an all-optical wavelength converter with high extinction ratio, low chirp, and high speed of operation.

Figure 8:
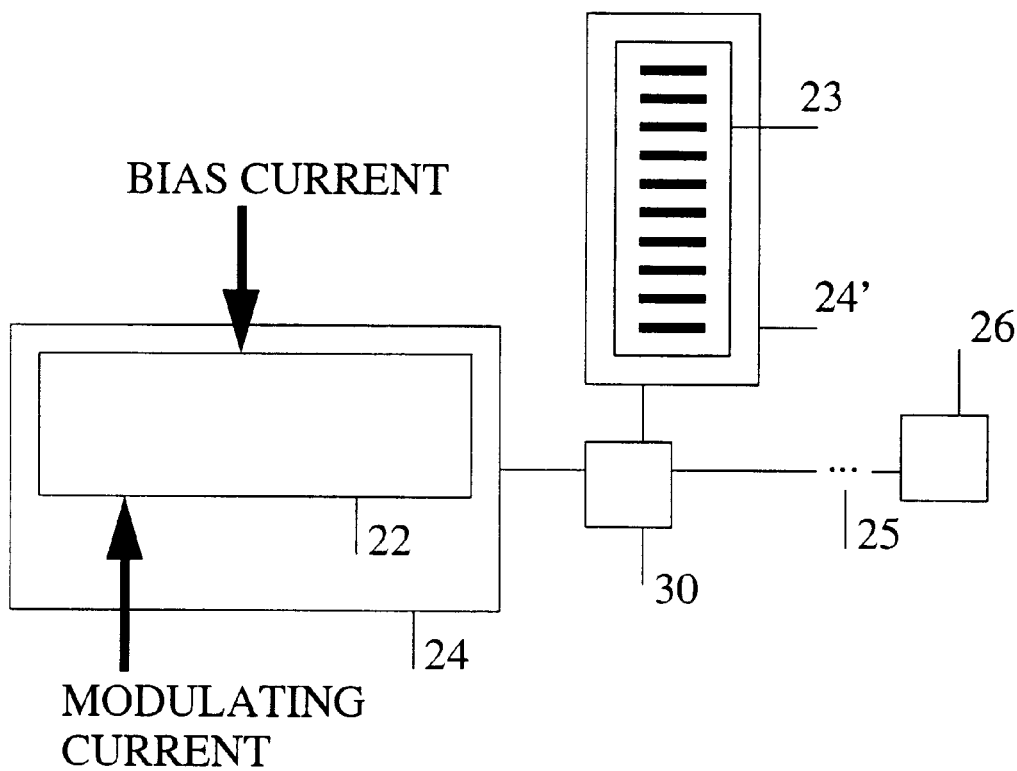
FIG. 8 Laser transmitter with fiber grating used in reflection.
Figure 9:
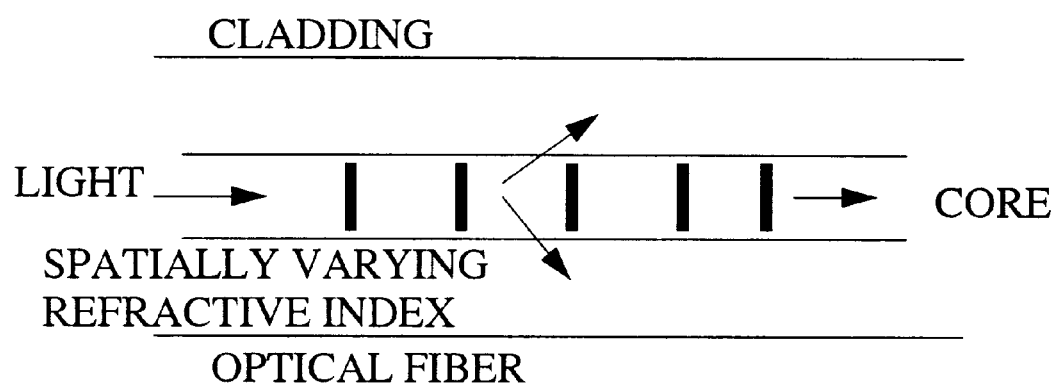
FIG. 9 Graphical representation of a long-period fiber grating discriminator.

It is understood that a fiber grating can be operated in reflection, in which case an optical circulator 30 can be used between the laser and fiber grating discriminator 23 as shown in FIG. 8. It is also understood that the fiber grating can be either a short-period grating or a long-period grating. In a short-period grating light is coupled from the forward-going core mode to the back-ward-going core mode. In a long-period fiber grating, the forward-going core mode is coupled into cladding modes as shown in FIG. 9. If desired, the spectrum of the long-period grating can be made insensitive to temperature variations by proper design of fiber composition and index profile as described, for example, in U.S. Pat. No. 5,703,978 (incorporated herein by reference).

Also, in another embodiment of this invention, the fiber grating discriminator 23 can be placed after the transmission fiber at the receiver 26.

Transform Limited Optical Pulse Source

Figure 10:
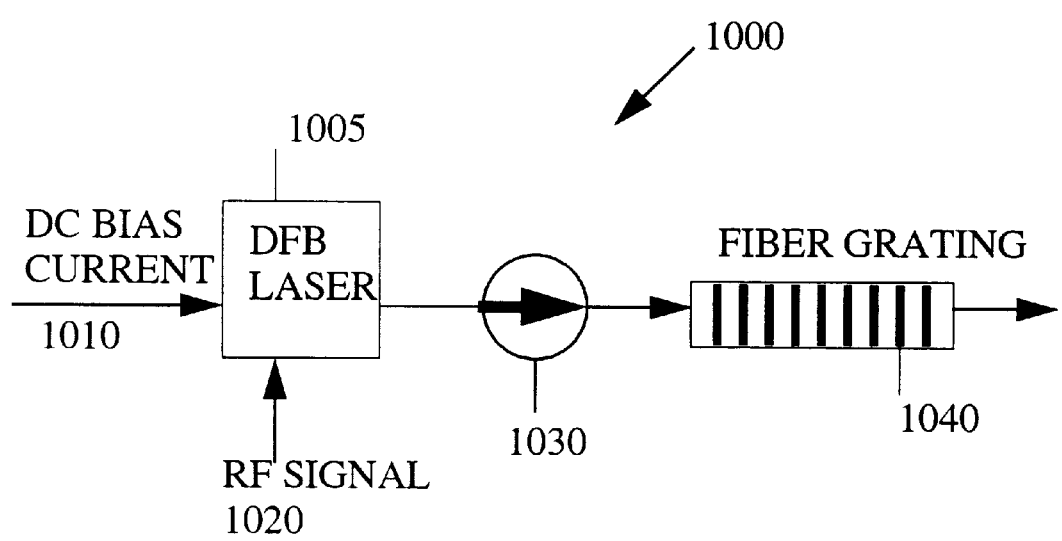
FIG. 10 is a diagram of an optical pulse generator according to a further embodiment of the present invention.
Figure 11:
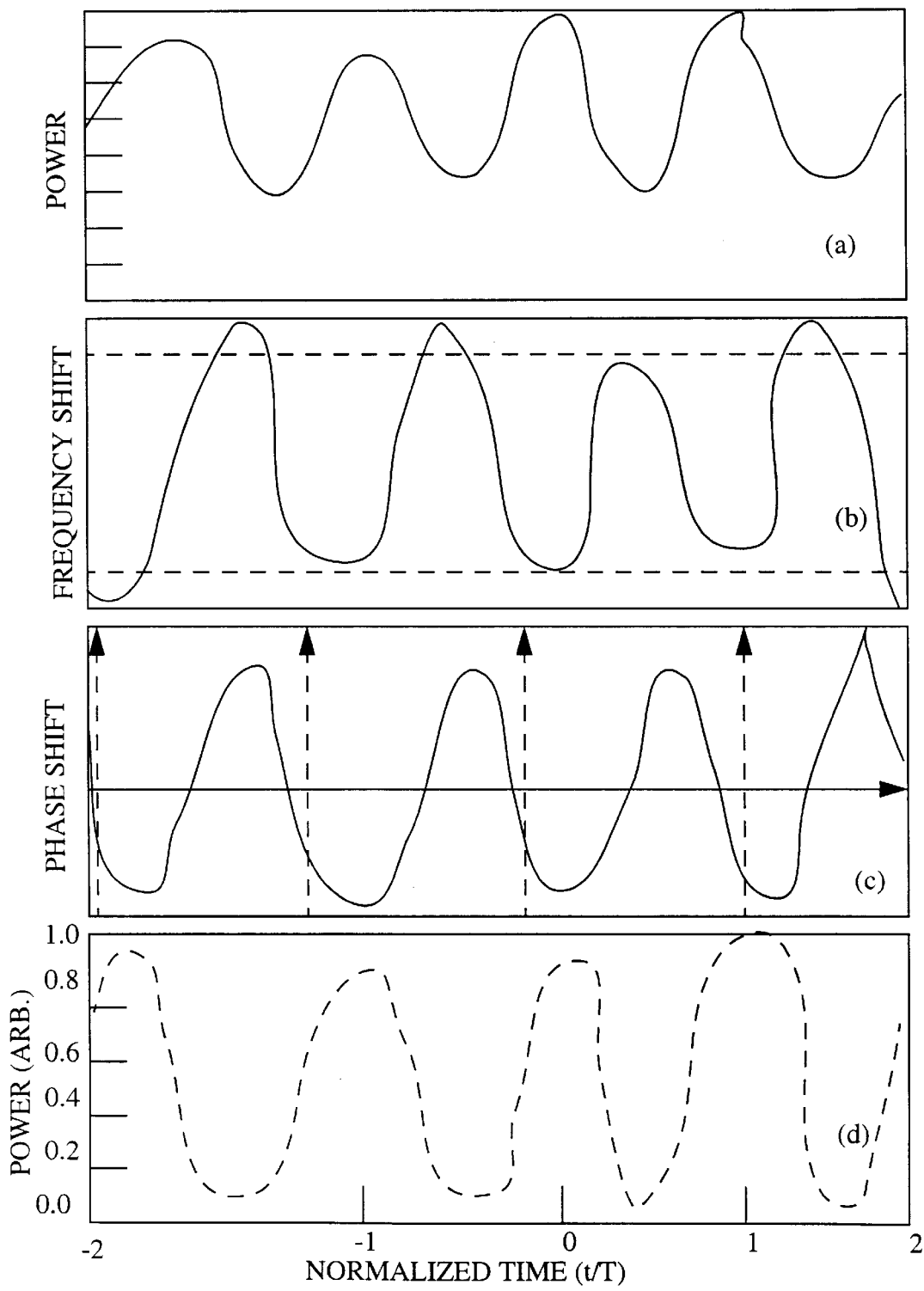
FIGS. 11A to 11D are plots of time-varying output characteristics of the optical pulse generator of FIG. 10 according to one example of the present invention.

According to another embodiment of the present invention, a simple pulse source comprises a directly modulated single mode semiconductor laser and a fiber Bragg grating filter. This embodiment is described with respect to FIGS. 10–15. The schematic of a laser pulse source 1000 is shown in FIG. 10. A single-mode semiconductor laser 1005, here a distributed feed-back laser is driven by the addition of a DC CW bias current 1010 and a sinusoidal current 1020 at the desired bit rate. For example, sinusoidal current 1020 can be a radio-frequency (RF) signal applied to directly modulate laser 1005. The output of laser 1005 is passed through a low pass or high pass fiber Bragg grating filter 1040 with a sharp edge. An optional isolator 1030 may be placed in an optical path between laser 1005 and fiber grating 1040 to further prevent any back-reflection from fiber grating 1040 to laser 1005.

The theory of operation is as follows. The output power P of laser pulse source 1000 as a function of time t can be written as $P(t)=P_0(1+m \sin(2\pi\Omega t))$, where $P_0$ is the average optical power, and m is the modulation depth, which is kept small compared to unity, and $\Omega$ is the modulation frequency. The intensity modulation is accompanied by phase modulation of laser pulse source 1000 which is amplified by the line width enhancement factor, $\alpha_H$. The time-varying frequency of the laser pulse source 1000 is given by $$\Delta v(t) \cong \frac{\alpha_H}{4\pi}\left(\frac{d}{dt}\ln P(t) + \kappa P(t)\right) \quad (1)$$

where $\kappa=2\Gamma\epsilon/V_{act}\eta h v$, $\Gamma$ is the modal confinement factor of the laser 1005, $\in$ is the so-called gain-compression factor that characterizes spectral hole-burning, $V_{act}$ is the active layer volume, $\eta$ is the quantum efficiency, and hv is photon energy. Using the relation $2\pi\Delta v(t)=d\phi/dt$, and the expression for power output above, the phase of the output light, $\phi$ is given by $$\phi(t) = -\frac{1}{2}\alpha_H \kappa P_0 t + \frac{1}{2}\alpha_H m \sqrt{1+(\kappa P_0/2\pi\Omega)^2}\cos(2\pi\Omega t + \theta), \quad (2)$$

where, $\theta=\tan^{-1}(\Omega/\kappa P_0)$.

The concept of pulse generation is demonstrated in FIGS. 11A to 11D which show, from top to bottom, the intensity (FIG. 11A), time-varying phase and frequency of the output of the modulated laser pulse source 1000 (FIGS. 11C and 11B). The laser intensity is sinusoidally modulated with a large continuous wave (CW) background through RF signal 1020. DC bias current 1010 can be a bias current that biases the laser 1005 high above the lasing threshold as described above with respect to FIG. 2. The frequency and phase of the output field of the laser 1005 also vary sinusoidally according to Eq. (1) and Eq. (2). Pulses are generated when light from the laser 1005 is passed through a high-pass or low-pass filter that blocks the CW and some of the adjacent side-modes, as indicated by the dashed lines of FIG. 11B. The corresponding phase of the laser field is nearly linear in time. Importantly, the phase of the field, shown in FIG. 11C, is nearly linear for the duration of the pulse, indicting that the pulses are nearly transform limited. FIG. 11D shows the result of low-pass filtering. High-pass filtering results in pulses that are time-shifted half cycle from the low-pass filtered pulses. The solid line in FIG. 11D is a fit of the pulse envelope to a Guassian.

In the present technique, a semiconductor laser 1005 is directly current modulated at the desired repetition frequency by RF signal 1020. This produces an amplitude and phase modulated optical signal.

The present invention takes advantage of the fact that the phase modulation accompanying the output field of a directly modulated semiconductor laser is large. In addition the phase modulation is correlated with the amplitude modulation. The additional sinusoidal intensity modulation slightly modifies the shape of the pulse envelope. However, the phase front of the filtered output remains chirp-free. The phase shift between the intensity modulation and the pulse envelopes, $\theta=\tan^{-1}(\Omega/\kappa P_0)$, can be varied by changing the output laser power and modulation frequency. This changes the pulse envelope without affecting the phase.

Figure 12:
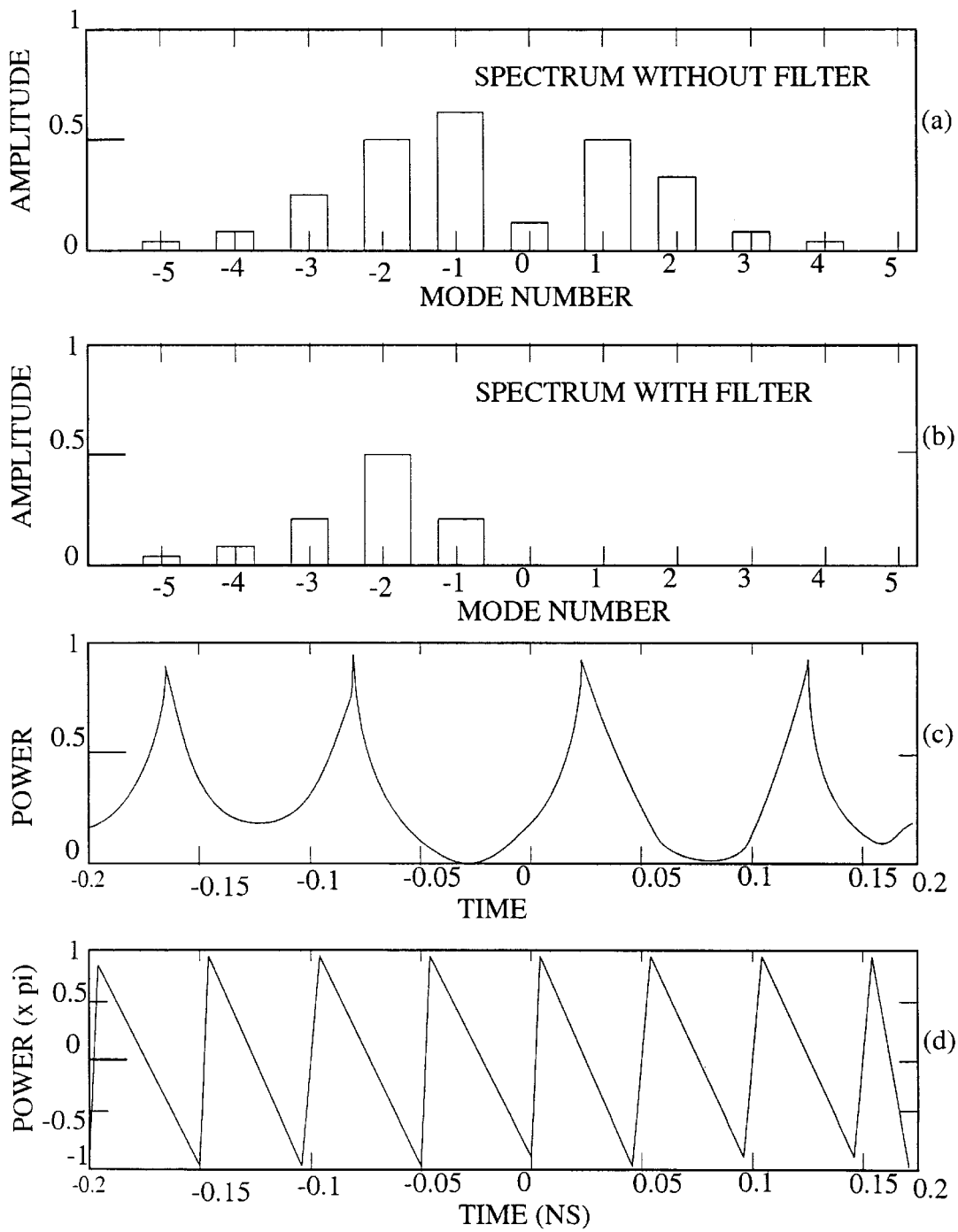
FIGS. 12A to 12D show further output characteristics of the optical pulse generator of FIG. 10 according to one example of the present invention.
Figure 13:
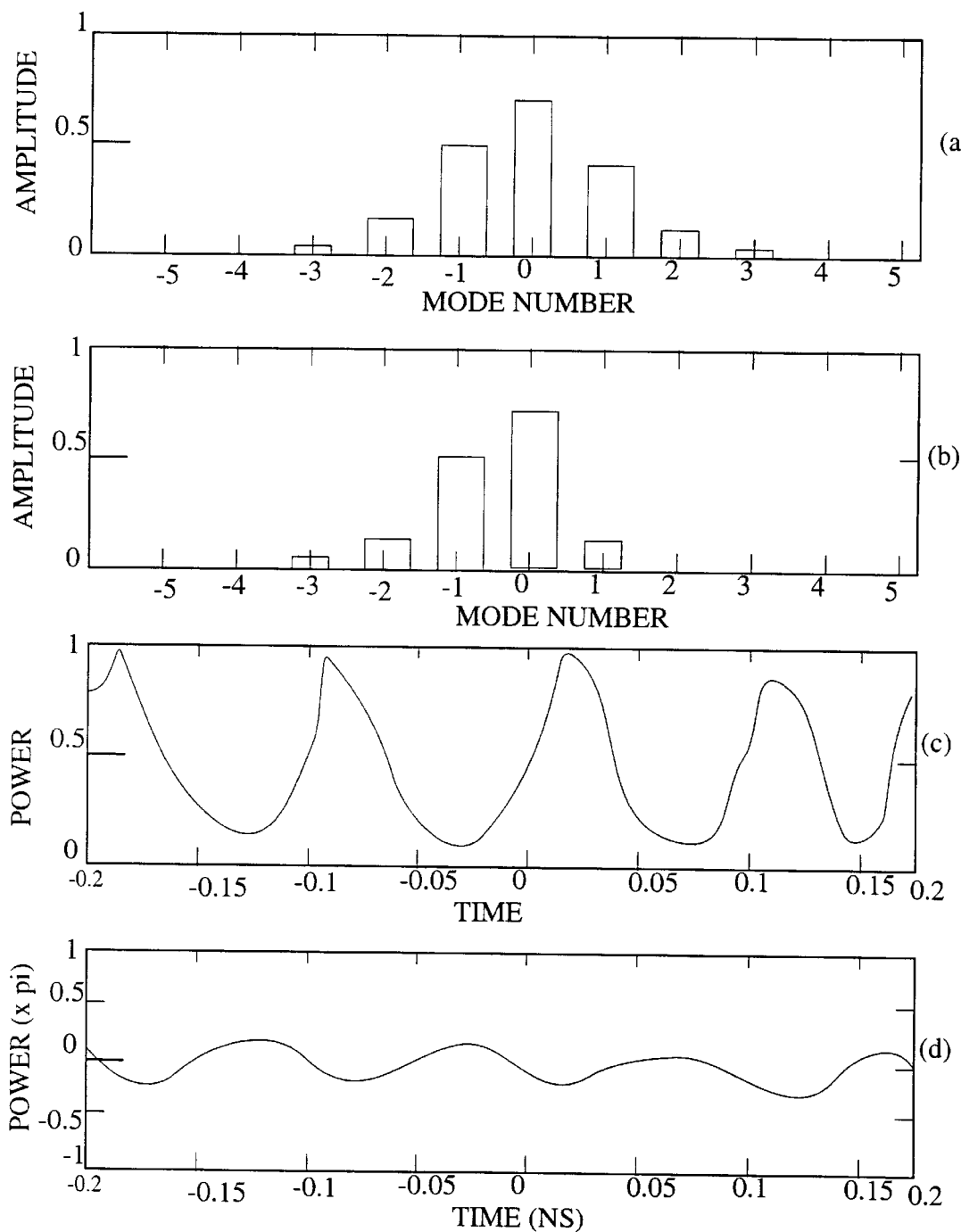
FIGS. 13A to 13D further output characteristics of the optical pulse generator of FIG. 10 according to another example of the present invention.
Figure 14:
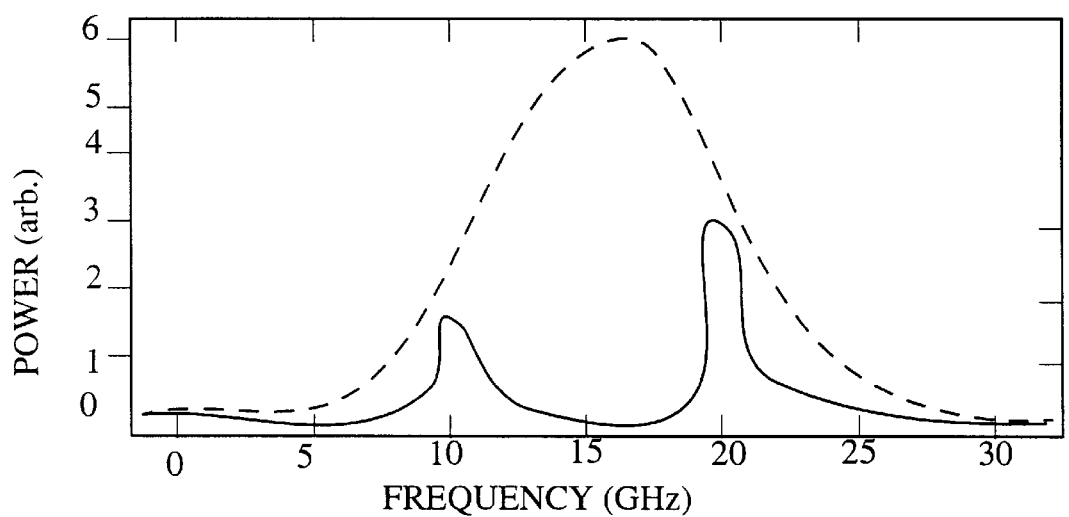
FIG. 14 shows an example output spectrum of an optical pulse generator according to another embodiment of the present invention.

FIGs. 12A–12D show the results of a calculation showing the spectrum of the modulated laser before and after low-pass filtering (FIGS. 12 A and 12B), the resulting pulse envelope (FIG. 12C) and linear phase variation across the pulse (FIG. 12D). The parameters used are: m=0.4, $\alpha_H$=10, $\Omega$=10 Ghz, $\kappa P_0$=2π×4.3 GHz. Also, terms of order $m^2$ have been neglected in the field modulation. Filtering out the positive frequency components and reducing the 1st side band on the negative frequency side by a factor 0.3 resulted in pulses with a FWHM=26 ps, and a CW background that was −17 dB relative to the peak of the pulse. The phase modulation amplitude was $$\frac{1}{2}\alpha_H m\sqrt{1+(\kappa P_0/2\pi\Omega)^2} = 2.0.$$

Note that a large linewidth enhancement factor will lead to larger phase modulation and hence shorter pulses. Also, total power that passes the filter increases with increasing $\alpha_H$. The modulation depth can be increased and leads to distortion of the pulse envelope. However, transform-limited (chirp-free) pulses can still be obtained by appropriate spectral filtering.

In a different mode of operation, the output of the modulated laser is low-pass filtered such that the central CW component and part of the first high frequency mode are kept. This is useful when the phase modulation amplitude is small, as is the case for a smaller linewidth enhancement factor. Similar results are obtained by high-pass filtering. FIGS. 13A–13D show the spectrum with and without filtering (FIGS. 13A and 13B) as well as the pulse envelope (FIG. 13C) and phase of the filtered signal (FIG. 13D). The phase of the pulses is nearly linear across the center of the pulse, becoming slightly curved in the wings of the pulse, where the intensity is low. The parameters used for this calculations are the same as above except for $\alpha_H$=5.

Figure 15:
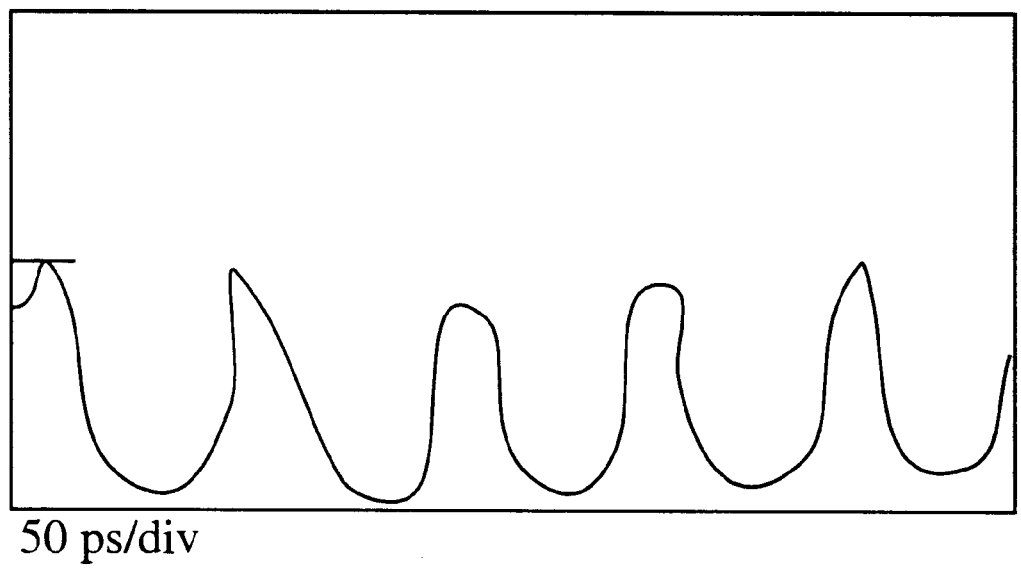
FIG. 15 shows an example sampling oscilloscope accumulation trace of the pulses corresponding to the embodiment of FIG. 14.

This second variation of the technique using a 1550 nm distributed feed-back laser 1005 and a fiber Bragg grating 1040 as the spectral filter was experimentally demonstrated. Laser 1005 was biased by DC bias current 1010 at 74.5 mA, high above its lasing threshold and modulated by RF signal 1020 with 15 dBm of RF power at 10 GHz. The resulting output power had an m=0.35 modulation depth. Fiber Bragg grating 1040 had a bandwidth of 0.5 nm and <−30 dB transmission at its center wavelength. The laser wavelength was temperature-tuned such as to place the high frequency sidebands of laser 1005 in the transmission band of the grating 1040, while blocking all but the first of the low frequency side bands. The first low frequency side-band was partially transmitted in simulations. The resulting output pulses had a FWHM width of 28.9 ps, obtained by fitting the autocorrelation to a Gaussian. The output spectrum, shown in FIG. 14 had a FWHM of 8.7 GHz. The time-bandwidth product of the 10 GHz pulses was 0.366. FIG. 15 shows the sampling oscilloscope accumulation trace of the pulses. Similar results were obtained by low-pass filtering the same spectrum.

It is important to note that the present pulse source 1000 is coherent and its timing is controlled by the RF source (RF signal 1020). It therefore does not have jitter as in the case of a gain-switched laser and should be appropriate as a RZ source for 10 Gb/s soliton transmission experiments. In addition the pulse repetition rate is tunable in this scheme.

Stabilization

Figure 16:
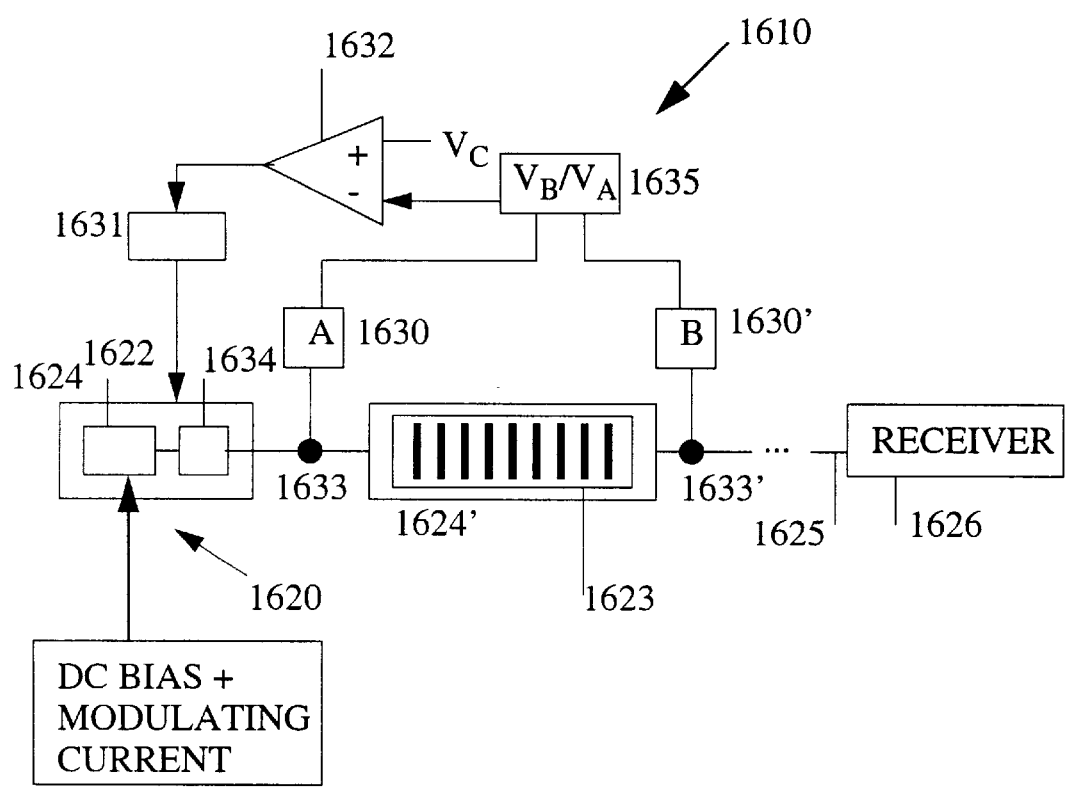
FIG. 16 is a diagram of a laser transmission system having data and wavelength stabilization according to another embodiment of the present invention.

FIG. 16 demonstrates the schematic for data and wavelength stabilization of a laser apparatus 1620 by a feed-back circuit 1610. Laser apparatus 1620 includes a semiconductor laser 1622 (such as, a DFB laser), a laser mounted 1624, and an optional optical isolator 1634. Feed-back circuit 1610 includes photodetectors 1630, 1630', divider 1635, differential amplifier 1632, and temperature controller 1631. A receiver 1626 can detect light transmitted through fiber Bragg grating 1623 over an optical fiber 1625. Optical fiber 1625 can be any type of fiber including, but not limited to, non-dispersion-shifted fiber. A grating mount 1624' supports fiber Bragg grating 1623.

A fiber coupler 1633 splits a fraction of the power at the output of the laser apparatus 1620 into a photodetector 1630. Another fiber coupler 1633' splits a small fraction of the optical power transmitted through the fiber Bragg grating 1623 and into a photodetector 1630'. The ratio of the voltages from detector 1630', $V_B$ to that of detector 1630, $V_A$ is obtained by a divider 1635. The electrical output of the divider, $V_B/V_A$, is compared to a reference voltage $V_C$ by a differential amplifier 1632.

A difference signal output by differential amplifier 1632 is used as feed-back to control the temperature of the laser by controller electronics 1631 which provides a current to the thermoelectric cooler 1624 on which the laser 1622 is mounted for temperature control. The feed-back loop keeps the ratio $V_B/V_A$ equal to the reference value which is a fraction approximately 50%–60%. This circuit shown in FIG. 16 stabilizes the ratio of 1 bits to 0 bits which ensures the integrity of the optical data in case of wavelength drift of the laser.

In order to elucidate this concept, the following describes a preferred embodiment in more detail. As described above, laser 1622 is biased high above its lasing threshold and its current directly modulated with a small amplitude. (An optical isolator 1634 is typically placed after a semiconductor laser 1622 to prevent light from feeding back into laser 1622). The optical frequency of a semiconductor laser 1622 changes with optical power upon modulation of carrier density.

The laser frequency has an adiabatic component which is proportional to the optical power as well as a transient chirp at the transitions between the 1 and 0 bits which is proportional to the logarithmic derivative of the power with time as described by Tkatch & Link, *Appl. Phys. Lett.* 48:613 (1986)(incorporated herein by reference). The laser 1622 can be designed to have large adiabatic chirp and low transient chirp as described in the literature. The chirp or instantaneous frequency excursion can be measured as a function of time as described by R. S. Vodhanel, R. S., et al., *J. Lightwave Technol* 7:10 (1989)(incorporated herein by reference).

Figure 17:
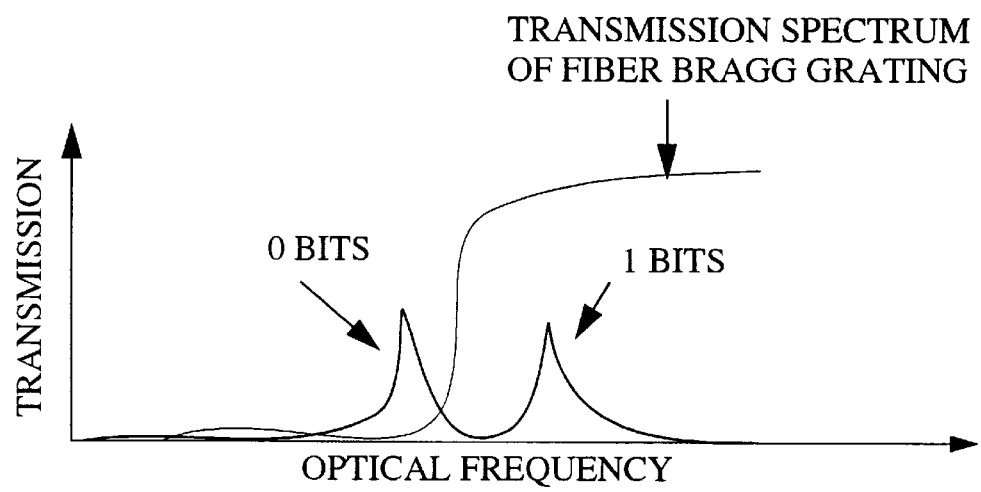
FIG. 17 is a diagram of an example transmission spectrum of a fiber Bragg grating in the laser transmission system of FIG. 16 set to transmit an optical frequency corresponding to a one bit and block an optical frequency corresponding to a zero bit.

Laser 1622 is operated in the small modulation regime where the adiabatic chirp can be dominant. This condition can be verified by measuring the instantaneous frequency excursion. In this case the high-resolution spectrum of the laser output reveals two closely spaced wavelength peaks corresponding to energy in the 1 bits and energy in the 0 bits. The spectral position of the laser wavelength relative to the transmission edge of the fiber Bragg grating 1623 should be such that the fiber Bragg grating 1623 transmits the frequency corresponding to the 1 bits and blocks the frequency corresponding to the 0 bits as shown in FIG. 17.

The role of the feed-back circuit 1610 can now be understood as follows. If the laser wavelength is adjusted properly, detector A(1630) measures a signal proportional to the sum of the powers in the 1 and 0 bits, $V_A=\alpha(P_1+P_0)$, where $\alpha$ is the product of the coupling fraction of coupler 1633 and detector A response, while detector B (1630') measures a signal proportional to the power in the 1 bits, $V_B=\beta P_1$, where $\beta$ is the product of coupling fraction of coupler 1633' and detector B response. The reference voltage will be set to $V_C=\beta P_1/\alpha(P_0+P_1)$. The ratio $V_B/V_A$ is compared to the set voltage $V_C$ by the differential amplifier 1632. If the laser wavelength changes to longer wavelengths, the ratio $V_B/V_A$ increases relative to $V_C$. This sets temperature controller 1631 to increase the temperature of the laser mount which increases laser wavelength and in turn decreases the ratio $V_B/V_A$ until $V_B/V_A=C$. If the laser wavelength drifts to shorter wavelengths relative to the transmission spectrum of the fiber grating, the ratio $V_B/V_A$ decreases relative to $V_C$ which sets controller 1631 to decrease laser temperature and push the wavelength back to longer values until $V_B/V_A=V_C$.

This will stabilize the ratio of 1 bits to the 0 bits, therefore preserving the shape and extinction ratio of the output optical data. The feed-back circuit 1610 also limits wavelength drift of the laser to the smaller of the frequency separation between the 1 bits and 0 bits and the transition bandwidth of the grating transmission.

Figure 18:
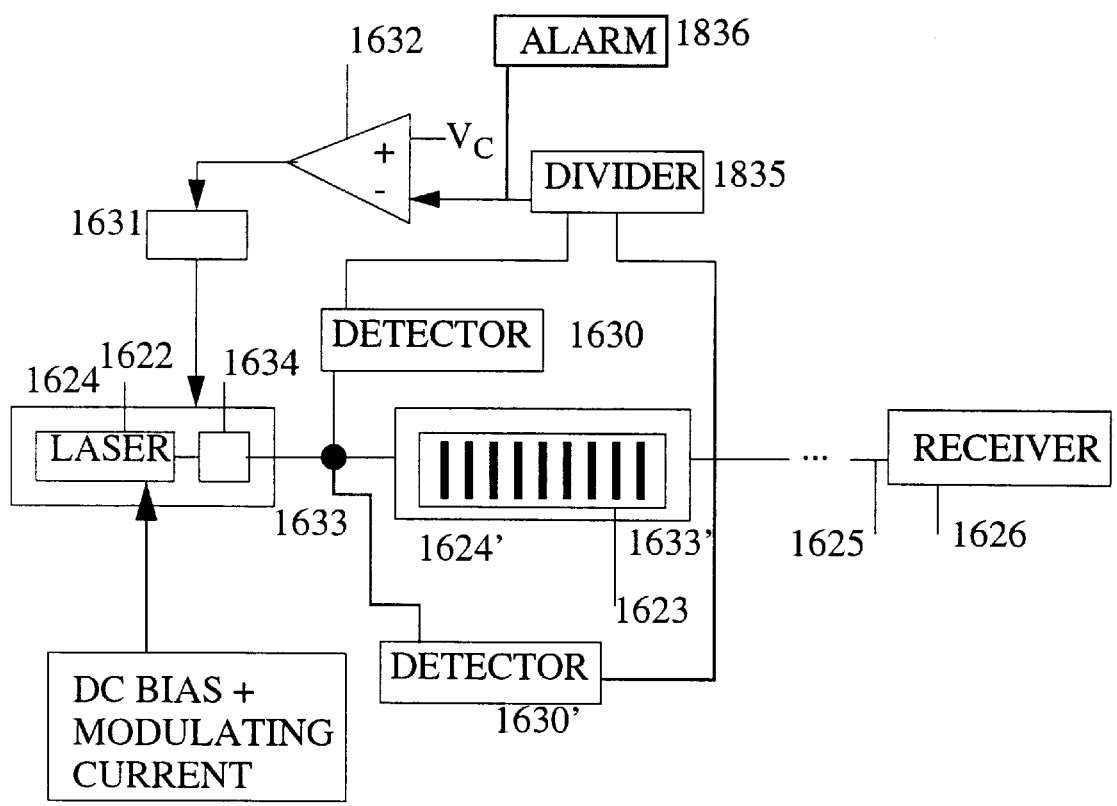
FIG. 18 is a diagram of a laser transmission system having data and wavelength stabilization according to further embodiment of the present invention.

In another embodiment, fiber coupler 1633 is used to pick out both the total power in the signal and the portion reflected by the fiber Bragg grating 1623 as shown in FIG. 18. A portion of the light travelling from the laser towards the grating and transmitted by it will thus impinge upon detector 1630 and, assuming proper operation, be proportional to the sum of the power in the 1 bit and 0 bits, $V_A$. A portion of the light reflected from the grating 1623 and traveling back towards the laser 1622 will be picked out by detector B (detector 1630'). This signal, $V_B$, is proportional to the power in the 0 bit, as this is the reflected portion. The power in the 1 bits is normally transmitted through the grating 1623. The ratio $V_B/V_A$ will now be compared with a fixed reference $V_C$. Similar to the above configuration, the differential amplifier 1632 and the temperature controller 1631 will keep the ratio of the power in 1 bits and 0 bits constant if the laser wavelength drifts.

In another embodiment, a circuit element such as a Schmitt trigger measures the error signal $V_C-V_B/V_A$, is compared to another constant voltage $V_{TH}$. If the error signal exceeds this set threshold value, an electrical alarm signal will be generated. With the proper choice of $V_{TH}$, the alarm will indicate the loss of optical data. If the electrical data signal is suddenly lost, the laser spectrum will change from a two-humped distribution in which the power in the signal is divided between the frequency corresponding to the 1 bits and the frequency corresponding to the 0 bits to a single frequency distribution having all the power. In addition, the frequency of the laser without data is not half way between the two humps in the presence of data. This is because the 1 bits carry more energy than the 0 bits for finite depth of modulation. Hence upon the loss of data, the laser spectrum will be lying somewhere other than the middle of the transition and carrying all the power. Hence the transmitted power through the grating will suddenly increase or decrease by a factor of approximately ~2. The circuit element 1836 can detect such a large sudden jump and trigger an electrical alarm indicating the loss of data.

Figure 19:
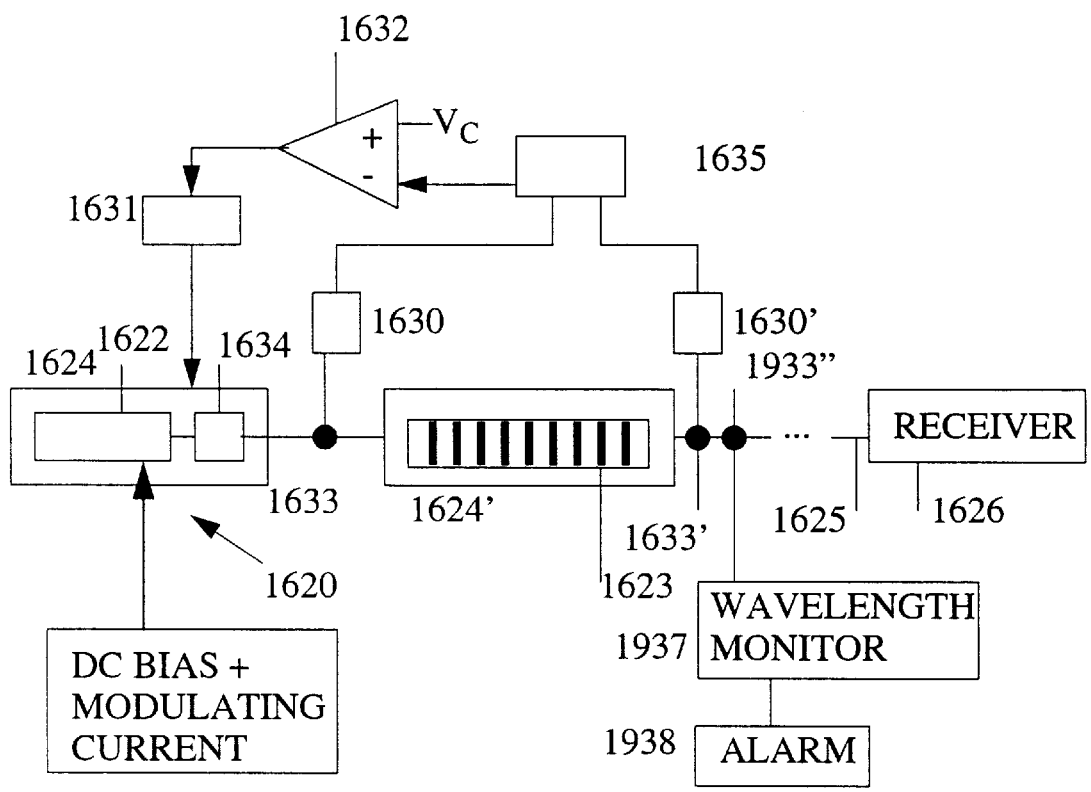
FIG. 19 is a diagram of a laser transmission system having data and wavelength stabilization according to further embodiment of the present invention.

In another embodiment, a data loss alarm can be realized by measuring the wavelength shift described above upon loss of data. In this embodiment (FIG. 19), a coupler 1933" placed after the fiber Bragg grating 1623 picks out a portion of the light output and couples it into a wavelength monitor device 1937. If the laser wavelength shifts by more than a set value in the presence of the stabilization circuit, an electrical alarm 1938 will alert the loss of data.

Figure 20:
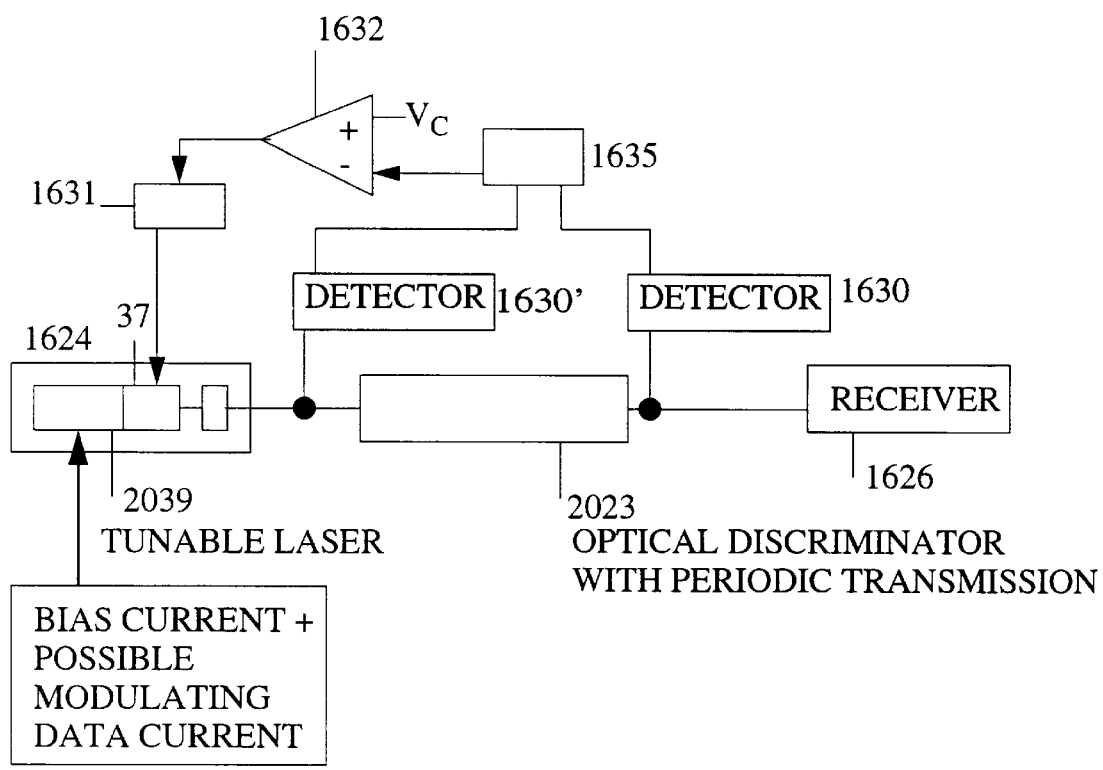
FIG. 20 is a diagram of a laser transmission system having data and wavelength stabilization according to further embodiment of the present invention.

Referring to FIG. 20, in another embodiment an optical filter element with a periodic transmission function having periodically spaced sharp transitions between 5% and 95% transmission is placed after the modulated laser to allow operation at a number of periodically spaced wavelength. A number of fiber Bragg grating discriminators connected in series shown in FIG. 4, a sampled fiber Bragg grating, or a Fabry-Perot filter with free-spectral range equal to the desired wavelength spacing and transitions between 5% and 95% transmission of few Ghz to discriminate between the optical frequency in the 1's and 0's are examples of such filter elements. Industry standards now require the wavelengths of optical channels in a wavelength division multiplexing system to all lie on a grid of predetermined wavelengths. Assuming that the laser can be tuned between these wavelengths, the data generation described in U.S. patent application No. 09/065,686 can be obtained at a multiplicity of wavelengths as set by the wavelengths channels of the periodic optical discriminator element. Detectors can be placed before and after the sampled grating and a feed-back circuit described above used in the manner to maintain the ratio of 1 bits to 0 bits.

EXAMPLE

In one example, a fiber Bragg grating high-pass filter is used after a DFB laser transmitter and demonstrate propagation over 600 km of NDS fiber at 2.5 Gb/s with <1 GHz wavelength stability. To the best of our knowledge, this is the longest propagation distance at 2.5 Gb/s in NDS fiber using direct modulation. However, it is contemplated that the present invention can be used for longer distances, as well.

A DFB laser (FIG. 21) is modulated directly to produce an optical signal with 20%–40% modulation depth. This minimizes transient chirp, leaving adiabatic chirp which makes ones and zeros have difference frequencies. A fiber Bragg grating with a sharp, step-like response passes the ones and blocks, the zeros. Hence most of the remaining energy has the same optical frequency and does not spread quickly upon propagation.

Figure 21:
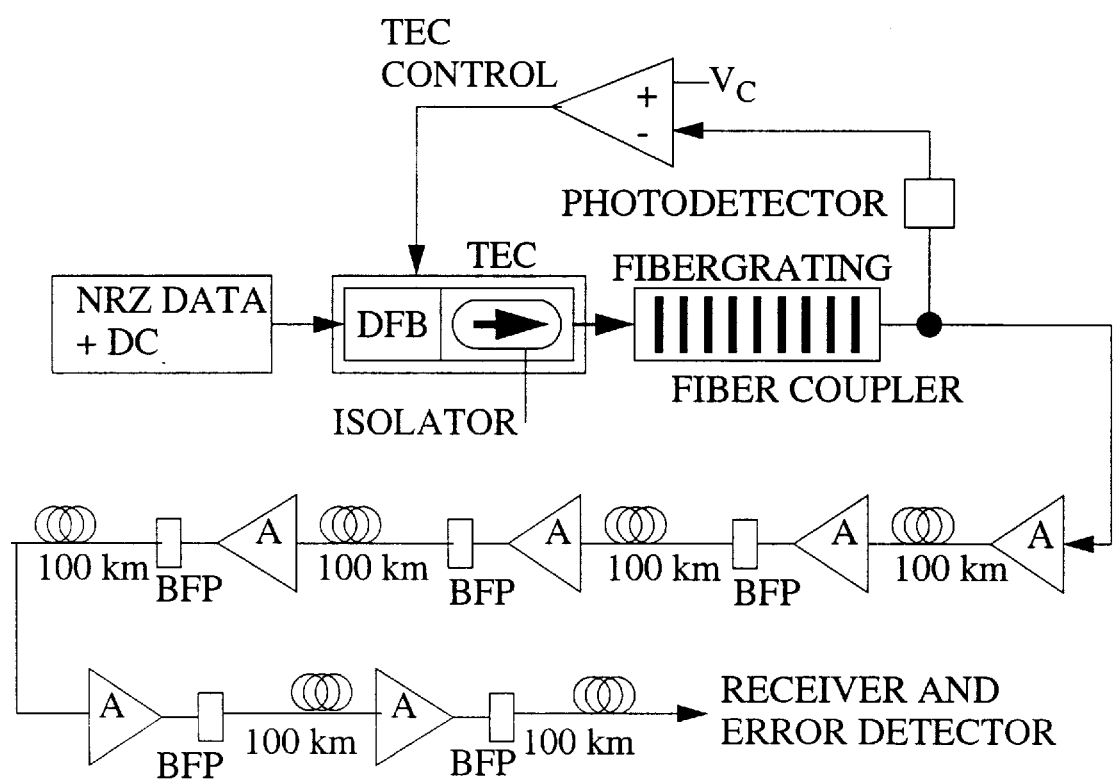
FIG. 21 is a schematic diagram of the DFB/Fiber-grating laser transmitter and fiber link. A: Erbium-doped fiber amplifier, BPF: Band-pass filter, TEC: Thermoelectric controller. The band-pass are used to suppress the ASE peak at 1530 nm. The average power through the grating is compared with a reference voltage to produce a control signal that locks the laser wavelength to the grating.

This example link consists of six 100 km spans of standard non-dispersion-shifted fiber with D-17 ps/rim-km and erblum-doped fiber amplifiers with gains of −25 dB (FIG. 21). The laser is biased at 100 mA and modulated with a 1.8 $V_{pp}$, $2^7-1$ long PRBS at 2.488 Gb/s. The laser is temperature-tuned to the blue transmission edge of the grating at 1547 nm where the grating has a 5% to 95% transmission width of −7 GHz. This results in a signal with 12 dB extinction ratio with 2.5 dB loss through the grating.

Figure 22:
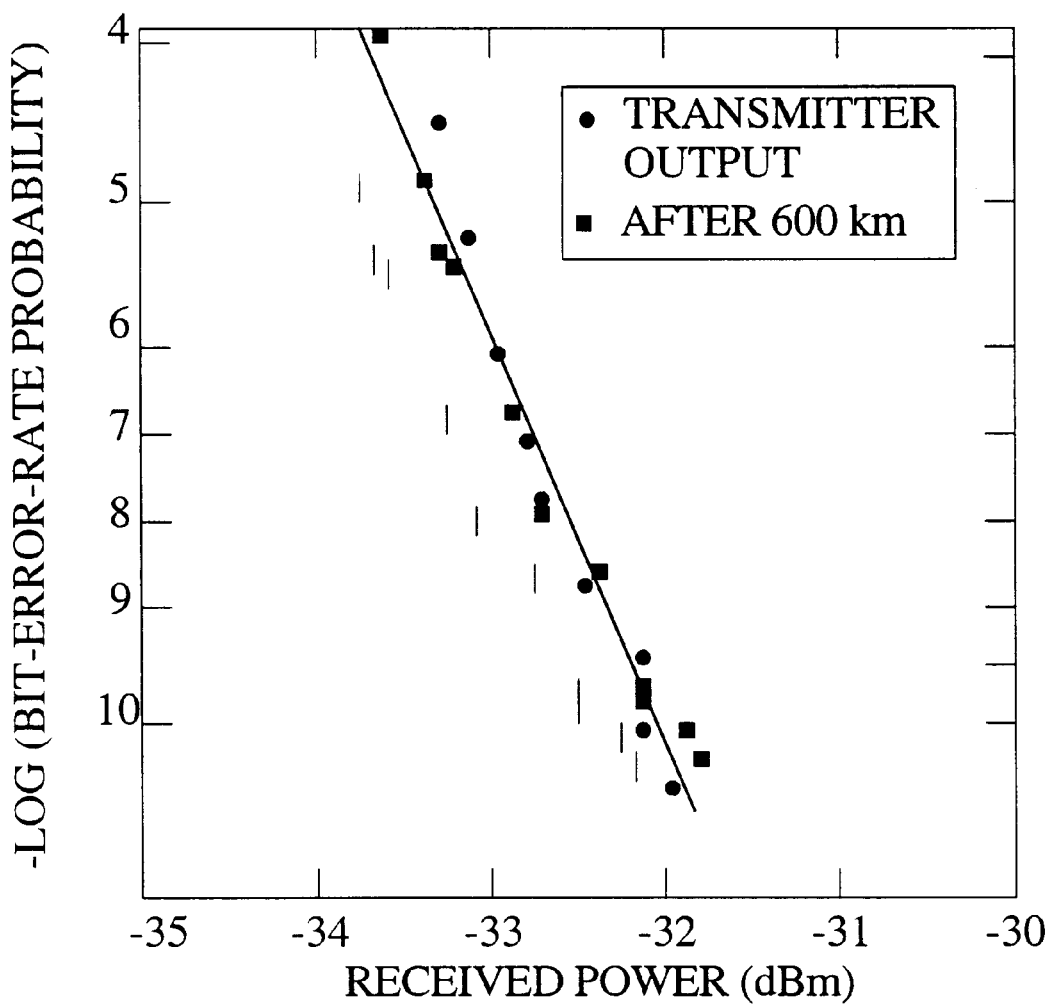
FIG. 22 show bit-error rate curves for $2^7-1$ PRBS data at 2.5 Gb/s generated by DFB/Fiber-grating transmitter: at its output (●), after 600 km of non-dispersion shifted fiber with dispersion of −17 ps/nm-km(■). The laser wavelength is 1574 nm.
Figure 23:
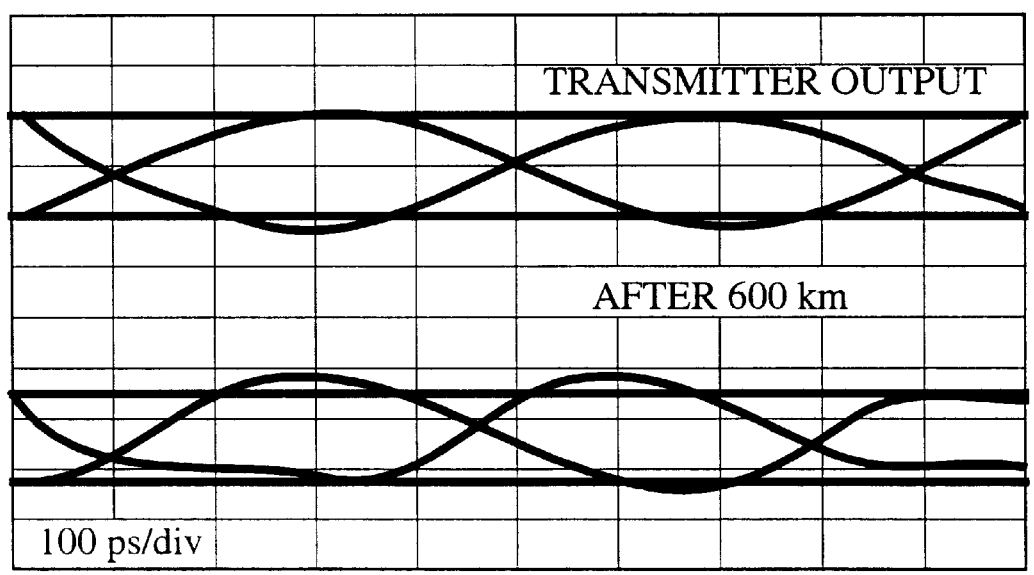
FIG. 23 are eye diagrams at 2.5 Gb/s. (top) output of transmitter. (bottom) after 600 km of non-dispersion-shifted fiber.
Figure 24:
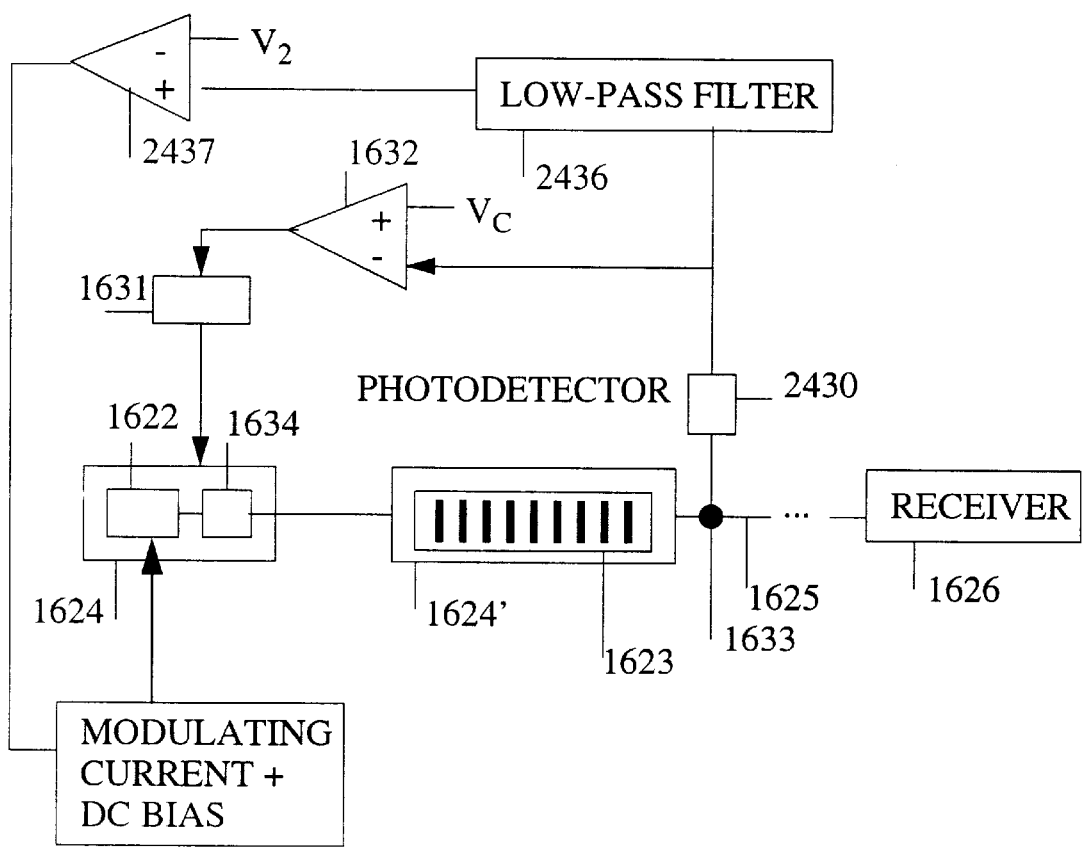
FIG. 24 is a schematic diagram of a laser transmission system having an equalization circuit for non-uniform FM response of laser according to a further embodiment of the present invention.

FIG. 22 shows the bit error-rate performance of our transmitter before and after 600 km of non-dispersion-shifted fiber. There is no dispersion penalty. Also the sensitivity at $10^{-9}$ BER was within 0.4 dB of that for an externally modulated $LiNbO_3$ at 0 km. FIG. 23 shows the eye diagrams. A feed-back loop was used to keep the laser frequency at the transmission edge of the grating and maintain the high extinction ratio over time. This also locked the laser wavelength within <1 GHz over 14 hours. The transmitter ran error-free over 24 hours.

Pattern lengths longer than $2^7-1$ produce distortions because of the non-uniform frequency response of the laser. This can be remedied by an equalizing feed-back circuit described in the following section.

Further Features and Enhancements

In the preferred embodiment, a laser is biased high above threshold and directly modulated to produce a small 20%–30% modulation depth. This optical signal is passed through a fiber Bragg grating optical discriminator which has a substantially sharp edge between a transmission maximum and a transmission minimum. The laser spectrum is composed of two very closely space peaks (typically separated by a few GHz) corresponding to the energy in the 1s and the energy in the 0s of the digitally coded modulation.

The grating spectrum is aligned with respect to the laser spectrum such as to block the frequency corresponding to the 0s and substantially pass the energy in the 1s (FIGS. 3 and 4). When the current of the laser is modulated with a non-return-to-zero digital signal, the Bragg grating discriminator converts the large frequency modulation of the laser to amplitude modulation, producing a signal with large contrast ration between the 1s and 0s.

It is known that the frequency response of the laser is non-uniform as a function of modulation frequency arising from the addition of the electronic and thermal responses. The thermal FM response of the laser is out-of phase with the electronic response. In telecommunication applications, the data driving the laser is a random sequence of 1s and 0s. In the NRZ mode of operation, these random sequences can have low frequency content. When the laser is modulated with such data, the laser's wavelength drifts in a time scale corresponding to the thermal relaxation of the laser chirp and is on the order of >0.1 $\mu$s. This can degrade the data quality after the discriminator and cause unwanted reduction in the amplitude of the 1s or increase in the amplitude of the 0s depending on the direction of drift and spectral position of filter relative to the laser spectrum.

Hence, it is an objective of the present continuation to equalize the amplitude of the 1s and 0s against the thermal drifts of the laser that arise from current modulation with data having low frequency content. See S. B. Alexander, D. Wolford, Electron. Lett. 21, 361 (1985) and S. Saito et al., Electron. Lett. 20, 703 (1984) (both incorporated by reference).

Figure 25:
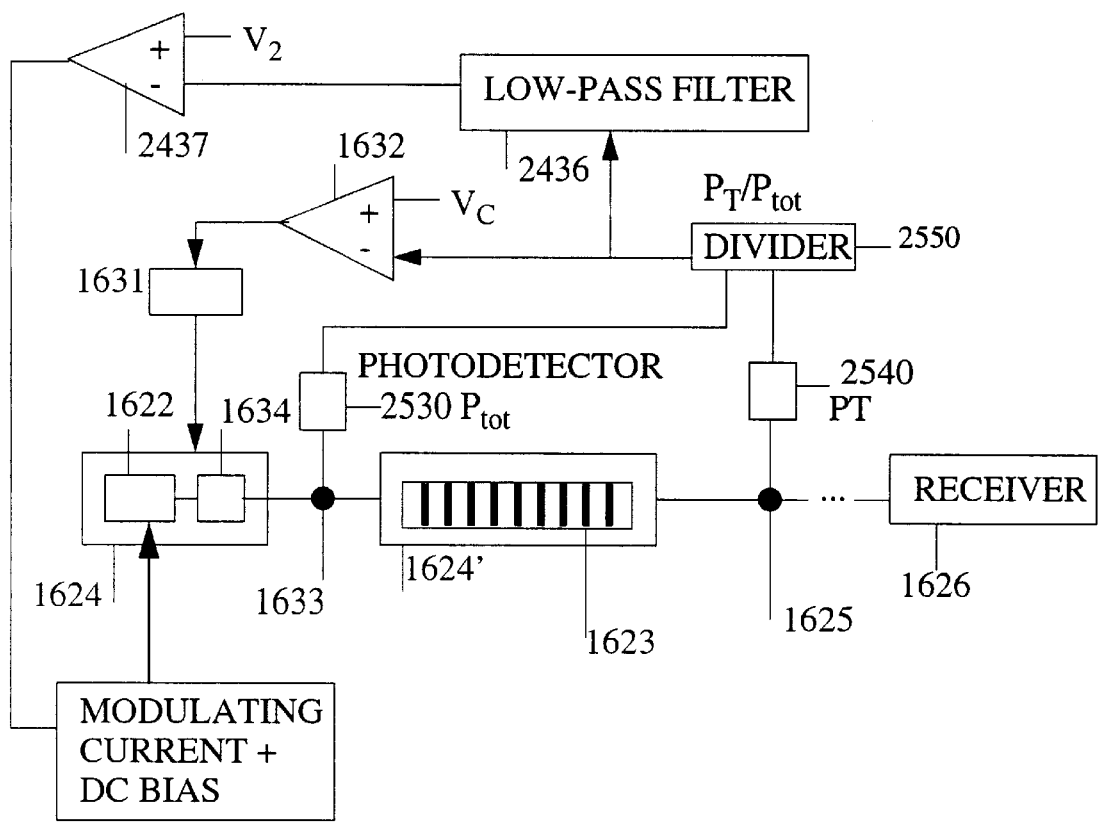
FIG. 25 is a schematic diagram of a laser transmission system with an equalization circuit of FM response according to another embodiment of the present invention.

In an embodiment of the present invention shown in FIG. 25, a portion of the light transmitted through the fiber Bragg grating 1623 is directed to a fast photodetector 2430. The response speed of the detector has to be higher than the thermal drift frequency of the laser which is a few MHZ in typical lasers. The voltage of the photodetector 2430 is split between two circuits. The first, which controls the average wavelength of the laser by controlling the laser temperature, was discussed above. The second circuit is used to control the faster temperature drifts that are caused by the NRZ injected current. The voltage from the photodetector 2430 is low-pass filtered via low pass filter 2436 to remove high frequency content. The cut-off frequency of the filter 2436 corresponds to the highest frequency content. The cut-off frequency of the filter 2436 corresponds to the highest frequency of the thermal response of the laser (typically ~10 MHZ). The output of the filter, $\xi P_1(t)$, is proportional to the amplitude of the 1s averaged over the thermal time constant of the laser. This is compared to a constant reference voltage, $V_1$ using a differential amplifier 2437. The difference voltage is amplified and added to the modulating current of the laser 1622. If the signal $\xi P_1(t)$ becomes higher than the reference, this means that the optical frequency of the laser has drifted to high frequency in the time-scale of the thermal response. The voltage generated by the comparison amplifier 2437 and the corresponding current, I(t), is therefore positive. This current is thus added to the modulation current and the DC bias. It is known that increasing the current decreases the laser frequency by heating the laser 1622. It is important that the amplitude modulation of the laser 1622 be small, so that the FM response dominates the AM response at these low frequencies. As the laser frequency averaged over the thermal time constant decreases, $\xi P_1(t)$ becomes lower until the error signal $\xi P_1(t) - V_1$ approaches zero.

In another embodiment of this invention, the coupler is placed before the Bragg grating 1623. In this case, the signal detected by photodetector 2430 is proportional to the energy in the 0s, $\xi P_0(t)$. An increase in $\xi P_0(t)$ implies that the laser frequency has drifted to smaller frequencies. The error signal generated tends to decrease the current and increase laser frequency, compensating the thermal drift caused by the low frequency content of the modulating data.

In another embodiment of the present invention, the average optical power of the laser 1622 is separately stabilized by detecting a portion of the light from the laser 1622 and comparing it to a set value. An error signal generated in this way increases the current if the power drops and vice-versa.

In another embodiment of the invention, a coupler 1633 is placed between the laser and the fiber Bragg grating 1623. A portion of the light from the laser 1622 is detected. The voltages generated from the detector 2540 after the grating in FIG. 25 is then divided by the total power via divider 2550 before it is processed to generate an error signal.

Figure 26:
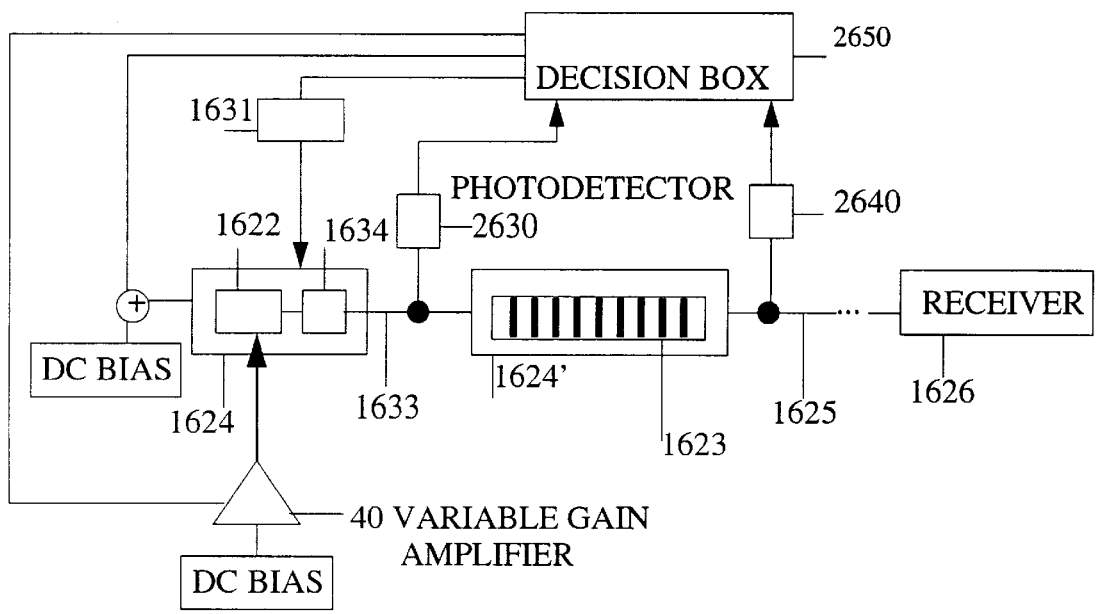
FIG. 26 is a schematic diagram of a laser transmission system with decision box controlling the transmitter output with respect to drift in various laser parameters according to another embodiment of the present invention.

Another objective of the present invention is to stabilize the performance of the laser/fiber grating transmitter against change in the laser parameters. Here a microprocessor or equivalent decision circuit is used to generate error signals based on the detection of various parameters to be numerated below and their comparison to set reference values. Referring to FIG. 26, two couplers are placed one before and one after the fiber Bragg grating 1623. They measure respectively voltages proportional to the power in the 0s (reflected power, $P_R$) and the power in the 1s (transmitted power $P_T$). The output of the microprocessor 2650 controls the average laser wavelength on a slow (1 sec) time scale, the thermal drifts that cause pattern dependence, and a voltage controlled amplifier that adjusts the amplitude modulation of the laser. The error signals will adjust laser bias current, current of the laser in a thermal time constant, and the amplitude of the data modulating the laser 1622 according to the following look-up table:

1. If $P_R$ increases and $P_T$ decreases on a thermal time scale: decrease current to laser on a thermal time scale until the error signal goes to zero.
2. If average $P_R$ increases and average $P_T$ decreases measured on slow powermeter: decrease temperature of the laser until the error signal goes to zero.
3. If $P_R$ decreases and $P_T$ increases on a thermal time scale: increase current to laser on a thermal time scale until the error signal goes to zero.
4. If average $P_R$ increases and average $P_T$ increases: decrease gain of modulating data until the error signal goes to zero.
5. If average $P_R$ decreases and average $P_T$ decreases: increase gain of modulating data until the error signal goes to zero.

Figure 27:
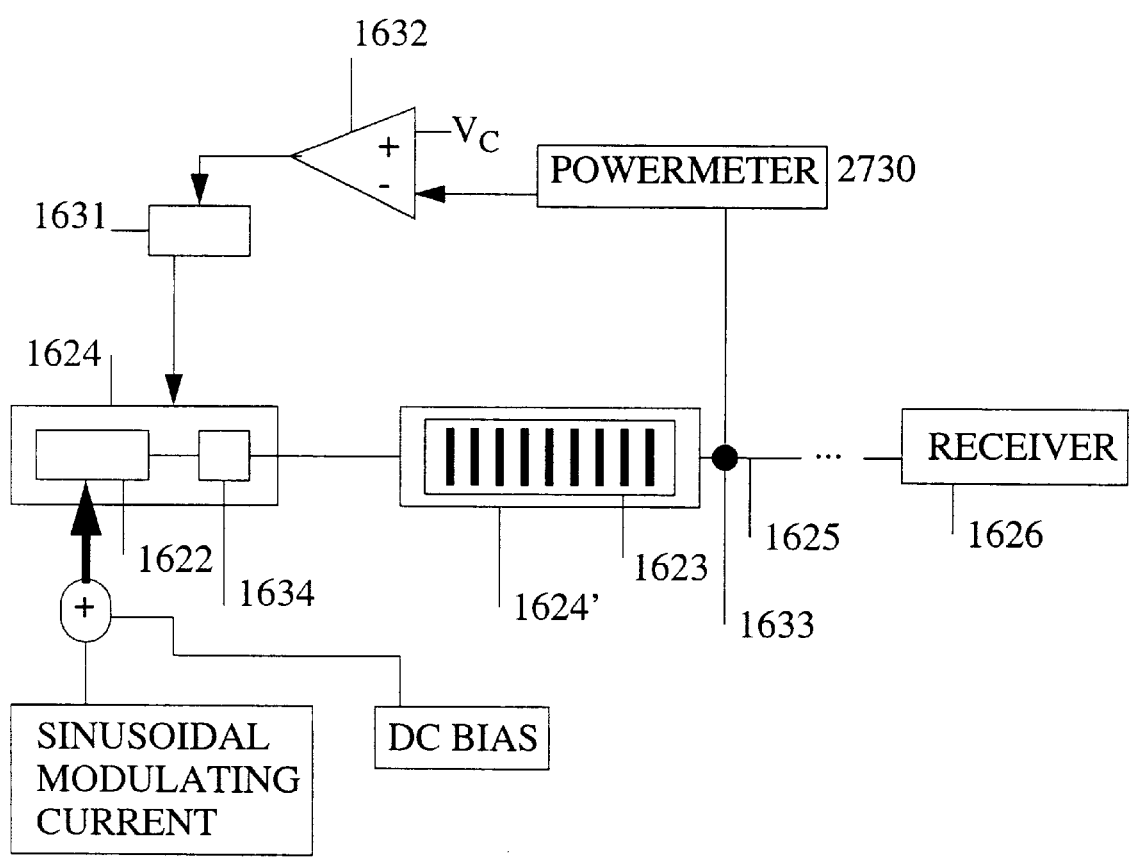
FIG. 27 is a schematic diagram of pulse generator with stabilization circuit according to another embodiment of the present invention.

Another objective of the present invention is to stabilize the pulses generated by using a directly modulated laser and a fiber Bragg grating as described herein. As shown in FIG. 27, the optical power transmitted through the grating 1623 is picked off from a fiber coupler 1633 and a power meter 2730. A comparator circuit generates an error signal that controls the temperature of the laser in order to keep the transmitted power through the grating 1623 fixed. A separate stabilization circuit, which can be internal to the laser package, keeps the optical output power of the laser 1622 fixed.

Figure 28:
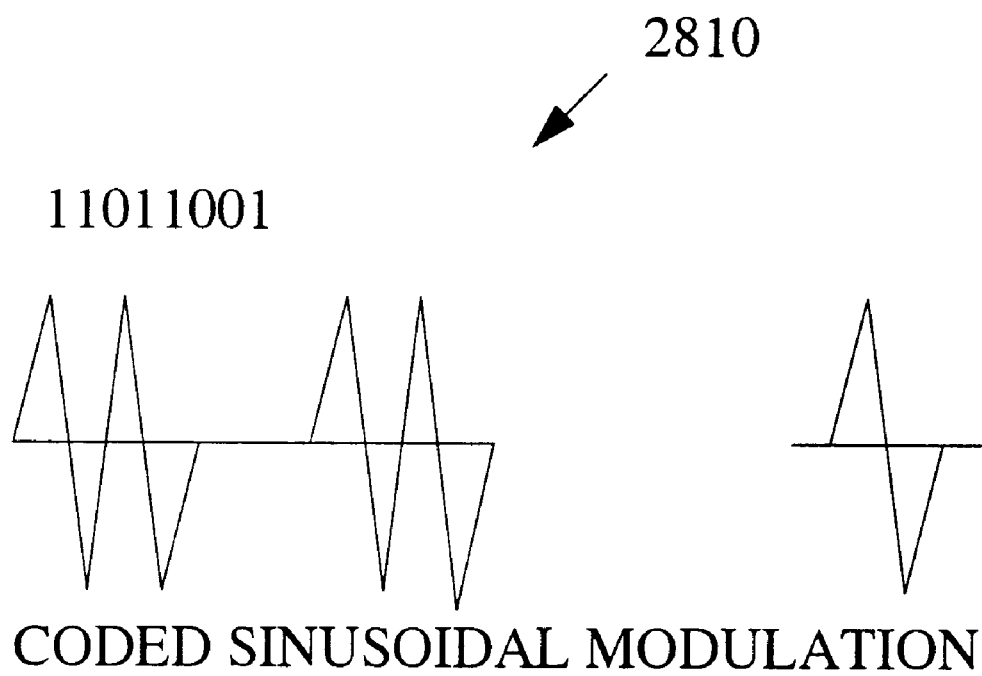
FIG. 28 shows a coded sinusoidal modulation.
Figure 29:
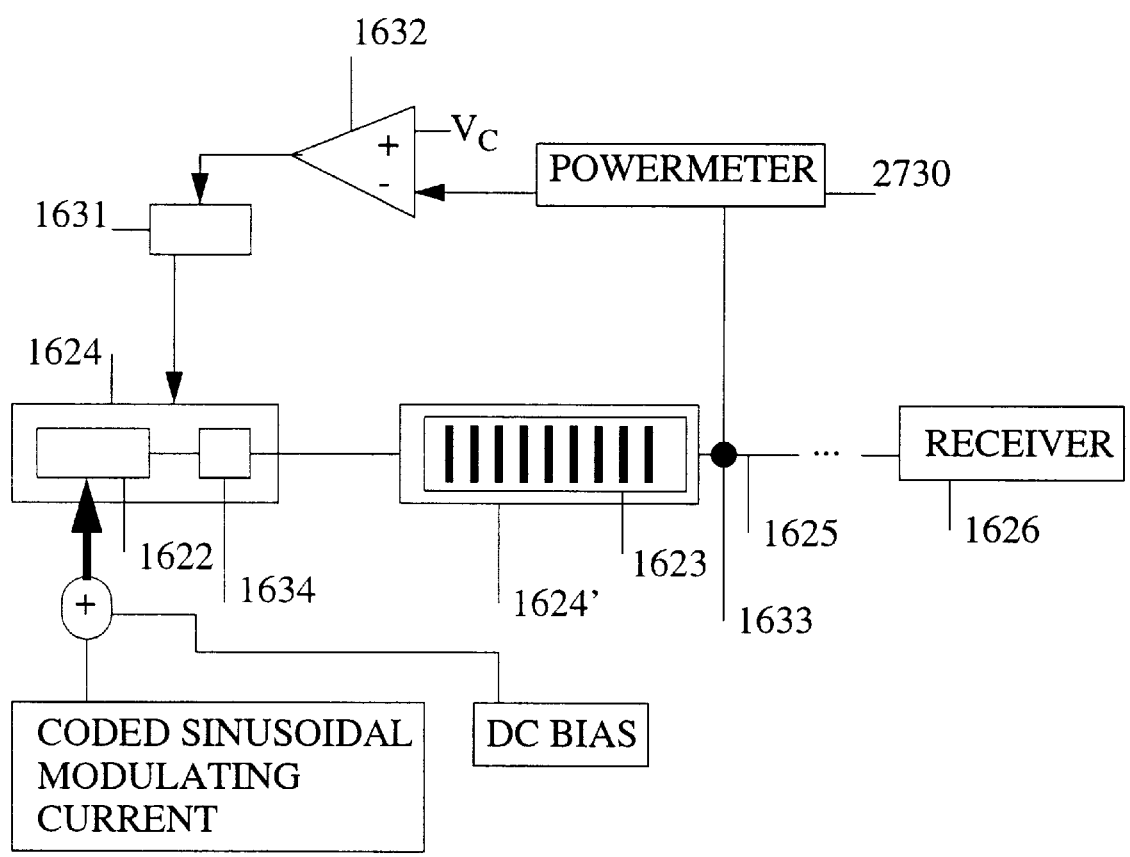
FIG. 29 is a schematic diagram for a return-to-zero transmitter according to another embodiment of the present invention.

In another embodiment of the pulse generator, the sinusoidal RF signal or clock is electrically modulated to produce a coded sinusoidal modulation 2810 as shown in FIGS. 28 and 29. Application of such a signal according to the laser 1622 followed by Bragg grating filter 1623 will produce return-to-zero formal pulses that are coded with the desired digital information.

Conclusion

While various embodiments of the present invention have been described above, it should be understood that they have been presented by way of example only, and not limitation. It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. Method of producing an optical pulse train, comprising the steps of:
    (a) biasing a laser at a user-definable bias point significantly above a threshold at which the laser lases to produce an optical signal;
    (b) modulating the optical signal to a modulation depth in the range from 20% to 40%;
    (c) filtering the modulated optical signal to produce the optical pulse train; and
    (d) maintaining a user-definable temperature.

2. The method of claim 1, wherein the step of biasing a laser is comprised of the step of biasing the laser with a current.

3. The method of claim 1, wherein the step of modulating the optical signal is comprised of the step of modulating the optical signal with a signal selected from the group of signals consisting of a modulating current, and optical signal, an RF signal, a modulating data current, NRZ data, RZ data, a sinusoidal current, and a coded sinusoidal modulation current.

4. The method of claim 1, wherein the step of filtering the modulated optical signal is comprised of the step of filtering the modulated optical signal through a step-like spectrum filter.

5. A device for producing an optical pulse train, comprising:
    (a) a laser, having a first input for biasing the laser, having an second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, and where the modulation signal is selected from the group of modulation signal consisting of a modulating current, an optical signal, an RF signal, a modulating data current, NRZ data, RZ data, a sinusoidal current, and a coded sinusoidal current;
    (b) a filter with a step-like spectrum, having an input connected to the output of the laser, and having an output; and
    (c) a temperature controller around the laser and the filter.

6. The device of claim 5, wherein the laser is a semiconductor laser.

7. The device of claim 5, wherein the filter is a fiber grating.

8. A device for producing an optical pulse train, comprising:
    (a) a laser, having a first input for biasing the laser, having an second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, and where the modulation signal is selected from the group of modulation signal consisting of a modulating current, an optical signal, an RF signal, a modulating data current, NRZ data, RZ data, a sinusoidal current, and a coded sinusoidal current;
    (b) an optical circulator, having a first input connected to the output of the laser, having a second input, and having an output;
    (c) a filter with a step-like spectrum connected to the second input of the optical circulator; and
    (d) a temperature controller around the laser and the filter.

9. A device for producing an optical pulse train, comprising:
    (a) a laser, having a first input for biasing the laser, having an second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, and where the modulation signal is selected from the group of modulation signal consisting of a modulating current, an optical signal, an RF signal, a modulating data current, NRZ data, RZ data, a sinusoidal current, and a coded sinusoidal current;
    (b) an optical isolator, having an input connected to the output of the laser, and having an output;
    (c) a filter with a step-like spectrum, having an input connected to the output of the optical circulator; and having an output; and
    (d) a temperature controller around the laser and the filter.

10. A device for producing an optical pulse train, comprising:
    (a) a laser, having a first input for biasing the laser, having an second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, and where the modulation signal is selected from the group of modulation signal consisting of a modulating current, an optical signal, an RF signal, a modulating data current, NRZ data, RZ data, a sinusoidal current, and a coded sinusoidal current;
    (b) an optical isolator, having a first input connected to the output of the laser, and having an output;
    (c) a first optical splitter, having an input connected to the output of the optical isolator, having a first output, and having a second output;
    (d) a filter with a step-like spectrum, having an input connected to the first output of the first optical splitter, and having an output;
    (e) a temperature controller around the laser, the optical isolator, and the filter;
    (f) a second optical splitter, having an input connected to the output of the filter, having a first output, and having a second output;

(g) a first photodetector, having an input connected to the second output of the first optical splitter, and having an output;

(h) a second photodetector, having an input connected to the second output of the second optical splitter and having an output;

(i) a divider, having a first input connected to the output of the first photodetector, having a second input connected to the output of the second photodetector, and having an output; and (j) an amplifier, having a negative input connected to the output of the divider, having a positive input for receiving a user-definable threshold voltage, and having an output connected to the temperature controller.

11. A device for producing an optical pulse train, comprising:

(a) a laser, having a first input for biasing the laser, having an second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, and where the modulation signal is selected from the group of modulation signal consisting of a modulating current, an optical signal, an RF signal, a modulating data current, NRZ data, RZ data, a sinusoidal current, and a coded sinusoidal current;

(b) an optical isolator, having a first input connected to the output of the laser, and having an output;

(c) an optical splitter, having an input connected to the output of the optical isolator, having a first output, having a second output, and having a third output;

(d) a filter with a step-like spectrum, having an input connected to the first output of the optical splitter, and having an output;

(e) a temperature controller around the laser, the optical isolator, and the filter;

(f) a first photodetector, having an input connected to the second output of the optical splitter, and having an output;

(g) a second photodetector, having an input connected to the third output of the optical splitter, and having an output;

(h) a divider, having a first input connected to the output of the first photodetector, having a second input connected to the output of the second photodetector, and having an output;

(i) an amplifier, having a negative input connected to the output of the divider, having a positive input for receiving a user-definable threshold voltage, and having an output connected to the temperature controller; and (j) an alarm circuit connected to the output of the divider.

12. A device for producing an optical pulse train, comprising:

(a) a laser, having a first input for biasing the laser, having a second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, and where the modulation signal is selected from the group of modulation signal consisting of a modulating current, an optical signal, an RF signal, a modulating data current, NRZ data, RZ data, a sinusoidal current, and a coded sinusoidal current;

(b) an optical isolator, having a first input connected to the output of the laser, and having an output;

(c) a first optical splitter, having an input connected to the output of the optical isolator, having a first output, and having a second output;

(d) a filter with a step-like spectrum, having an input connected to the first output of the optical splitter, and having an output;

(e) a temperature controller around the laser, the optical isolator, and the filter;

(f) a second optical isolator, having an input connected to the output of the filter, having a first output, and having a second output;

(g) a third optical splitter, having an input connected to the first output of the second optical splitter, having a first output, and having a second output;

(h) a first photodetector, having an input connected to the second output of the first optical splitter, and having an output;

(i) a second photodetector, having an input connected to the second output of the second optical splitter, and having an output;

(j) a divider, having a first input connected to the output of the first photodetector, having a second input connected to the output of the second photodetector, and having an output;

(k) an amplifier, having a negative input connected to the output of the divider, having a positive input for receiving an user-definable threshold voltage, and having an output connected to the temperature controller;

(l) a wavelength monitor, having an input connected to the second output of the third optical filter, and having an output; and (m) an alarm circuit connected to the output of the wavelength monitor.

13. A device for producing an optical pulse train, comprising:

(a) a laser, having a first input for biasing the laser, having an second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, and where the modulation signal is selected from the group of modulation signal consisting of a modulating current, an optical signal, an RF signal, a modulating data current, NRZ data, RZ data, a sinusoidal current, and a coded sinusoidal current;

(b) an optical isolator, having a first input connected to the output of the laser, and having an output;

(c) a first optical splitter, having an input connected to the output of the optical isolator, having a first output, and having a second output;

(d) an optical discriminator with periodic transmission, having an input connected to the first output of the first optical splitter, and having an output;

(e) a temperature controller around the laser, the optical isolator, and the optical discriminator;

(f) a second optical splitter, having an input connected to the output of the optical discriminator, having a first output, and having a second output;

(g) a first photodetector, having an input connected to the second output of the first optical splitter, and having an output;

(h) a second photodetector, having an input connected to the second output of the second optical splitter, and having an output;

(i) a divider, having a first input connected to the output of the first photodetector, having a second input connected to the output of the second photodetector, and having an output; and (j) an amplifier, having a negative input connected to the output of the divider, having a positive input for receiving a user-definable threshold voltage, and having an output connected to the temperature controller.

14. A device for producing an optical pulse train, comprising:

(a) a laser, having a first input for biasing the laser, having an second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, and where the modulation signal is selected from the group of modulation signal consisting of a modulating current, an optical signal, an RF signal, a modulating data current, NRZ data, RZ data, a sinusoidal current, and a coded sinusoidal current;

(b) an optical isolator, having a first input connected to the output of the laser, and having an output;

(c) a filter with a step-like spectrum, having an input connected to the output of the optical isolator, and having an output;

(d) a temperature controller around the laser, the optical isolator, and the filter;

(e) an optical splitter, having an input connected to the output of the filter, having a first output, and having a second output;

(f) a powermeter, having an input connected to the second output of the optical splitter, and having an output; and (g) an amplifier, having a negative input connected to the output of the powermeter, having a positive input for receiving a user-definable threshold voltage, and having an output connected to the temperature controller.

15. A device for producing an optical pulse train, comprising:

(a) a laser, having a first input for biasing the laser, having a second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, where the modulation signal is selected from the group of modulation signal consisting of a modulating current, an optical signal, an RF signal, a modulating data current, NRZ data, RZ data, a sinusoidal current, and a coded sinusoidal current, and having a third input for receiving a signal to be combined with the second input;

(b) an optical isolator, having a first input connected to the output of the laser, and having an output;

(c) a first filter with a step-like spectrum, having an input connected to the output of the optical isolator, and having an output;

(d) a temperature controller around the laser, the optical isolator, and the first filter;

(e) an optical splitter, having an input connected to the output of the first filter, having a first output, and having a second output;

(f) a photodetector having an input connected to the second output of the optical splitter, and having an output;

(g) a first amplifier having a negative input connected to the output of the photodetector, having a positive input for receiving a user-definable threshold voltage, and having an output connected to the temperature controller;

(h) a second filter, having an input connected to the output of the photodetector, and having a output; and (j) a second amplifier, having a negative input connected to the output of the second filter, having a positive input for receiving a user-definable threshold voltage, and having an output connected to the third input of the laser.

16. A device for producing an optical pulse train, comprising:

(a) a laser, having a first input for biasing the laser, having an second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, where the modulation signal is selected from the group of modulation signal consisting of a modulating current, an optical signal, an RF signal, a modulating data current, NRZ data, RZ data, a sinusoidal current, and a coded sinusoidal current, and having a third input for receiving a signal to be combined with the second input;

(b) an optical isolator, having a first input connected to the output of the laser, and having an output;

(c) a first optical splitter, having an input connected to the output of the optical isolator, having a first output, and having a second output;

(d) a first filter with a step-like spectrum, having an input connected to the output of the first optical splitter, and having an output;

(e) a temperature controller around the laser, the optical isolator, and the first filter;

(f) a second optical splitter, having an input connected to the output of the first filter, having a first output, and having a second output;

(g) a first photodetector, having an input connected to the second output of the first optical splitter, and having an output;

(h) a second photodetector, having an input connected to the second output of the second optical splitter, and having an output;

(i) a divider, having a first input connected to the output of the first photodetector, having a second input connected to the output of the second photodetector, and having an output;

(j) a first amplifier having a negative input connected to the output of the divider, having a positive input for receiving a user-definable threshold voltage, and having an output connected to the temperature controller;

(k) a second filter, having an input connected to the output of the divider, and having a output; and (l) a second amplifier, having a negative input connected to the output of the second filter, having a positive input for receiving a user-definable threshold voltage, and having an output connected to the third input of the laser.

17. A device for producing an optical pulse train, comprising:

(a) a laser, having a first input for biasing the laser, having an second input for modulating the laser, having an output, where the first input receives a bias current that biases the laser to a user-definable point significantly above the threshold at which the laser lases, where the second input receives a modulation signal that modulates the output of the laser to a modulation depth in the range of from 20% to 40%, where the modulation signal is selected from the group of modulation signal consisting of a modulating current, an optical signal, an RF signal, a modulating data current, NRZ data, RZ data, a sinusoidal current, and a coded sinusoidal current, having a third input for receiving a signal to be combined with the second input, and having a fourth input for receiving a signal to be combined with the first input;

(b) an optical isolator, having a first input connected to the output of the laser, and having an output;

(c) a first optical splitter, having an input connected to the output of the optical isolator, having a first input, and having a second output;

(d) a first filter with a step-like spectrum, having an input connected to the output of the first optical splitter, and having an output;

(e) a temperature controller around the laser, the optical isolator, and the first filter;

(f) a second optical splitter, having an input connected to the output of the first filter, having a first output, and having a second output;

(g) a first photodetector, having an input connected to the second output of the first optical splitter, and having an output;

(h) a second photodetector, having an input connected to the second output of the second optical splitter and having an output; and (i) a controller, having a first input connected to the output of the first photodetector, having a second input connected to the output of the second photodetector, having a first output connected to the temperature controller, having a second output connected to the third input of the laser, and having a third output connected to the fourth input of the laser.

* * * * *